(12) United States Patent
Tani et al.

(10) Patent No.: US 9,985,605 B2
(45) Date of Patent: May 29, 2018

(54) FILTER CIRCUIT AND WIRELESS COMMUNICATION APPARATUS

(71) Applicant: Murata Manufacturing Co., Ltd., Kyoto (JP)

(72) Inventors: Masakazu Tani, Kyoto (JP); Shouzo Sugiyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/232,372

(22) Filed: Aug. 9, 2016

(65) Prior Publication Data

US 2016/0352310 A1    Dec. 1, 2016

Related U.S. Application Data

(63) Continuation of application No. PCT/JP2015/053169, filed on Feb. 5, 2015.

(30) Foreign Application Priority Data

Feb. 10, 2014  (JP) .................................. 2014-023343
Sep. 30, 2014  (JP) .................................. 2014-202077

(51) Int. Cl.
| | |
|---|---|
| *H03H 7/00* | (2006.01) |
| *H03H 9/54* | (2006.01) |
| *H03H 9/56* | (2006.01) |
| *H03H 9/60* | (2006.01) |
| *H03H 9/64* | (2006.01) |

(Continued)

(52) U.S. Cl.
CPC .......... *H03H 9/542* (2013.01); *H03H 7/0153* (2013.01); *H03H 7/12* (2013.01); *H03H 9/568* (2013.01); *H03H 9/605* (2013.01); *H03H 9/64* (2013.01); *H03H 9/6403* (2013.01); *H03H 9/6483* (2013.01); *H04B 1/525* (2013.01); *H03H 2210/025* (2013.01)

(58) Field of Classification Search
CPC ........... H03H 9/542; H03H 9/64; H04B 1/525
See application file for complete search history.

(56) References Cited

U.S. PATENT DOCUMENTS

| | | |
|---|---|---|
| 8,026,776 B2 | 9/2011 | Ueda et al. |
| 2001/0048352 A1 | 12/2001 | Klee |

(Continued)

FOREIGN PATENT DOCUMENTS

| | | |
|---|---|---|
| CN | 1529410 A | 9/2004 |
| CN | 101540590 A | 9/2009 |

(Continued)

OTHER PUBLICATIONS

International Search Report issued in application No. PCT/JP2015/053169 dated Apr. 18, 2015.

(Continued)

*Primary Examiner* — Ping Hsieh
(74) *Attorney, Agent, or Firm* — Pearne & Gordon LLP

(57) ABSTRACT

A filter circuit includes a serial arm connected between ports (P1-P2), a parallel arm having a resonator connected in series between ports (P1-P3), and another parallel arm having another resonator connected in series between ports (P2-P3). The serial arm includes a switching circuit, and the switching circuit connects an inductor or a capacitor to the serial arm in series using a switch.

19 Claims, 20 Drawing Sheets

(51) Int. Cl.
*H04B 1/525* (2015.01)
*H03H 7/01* (2006.01)
*H03H 7/12* (2006.01)

(56) References Cited

U.S. PATENT DOCUMENTS

| | | |
|---|---|---|
| 2004/0058664 A1 | 3/2004 | Yamamoto |
| 2004/0119561 A1 | 6/2004 | Omote |
| 2005/0099244 A1 | 5/2005 | Nakamura et al. |
| 2008/0252397 A1* | 10/2008 | Stuebing ............... H03H 9/542 333/189 |
| 2009/0201104 A1 | 8/2009 | Ueda |
| 2011/0199169 A1 | 8/2011 | Kadota |
| 2012/0313731 A1* | 12/2012 | Burgener ............... H03H 9/542 333/188 |
| 2013/0203364 A1* | 8/2013 | Darnell ................. H01Q 1/243 455/77 |
| 2014/0218133 A1* | 8/2014 | Jian .................... H03H 9/02992 333/193 |
| 2015/0293159 A1* | 10/2015 | van Bezooijen ......... H03H 7/40 333/32 |

FOREIGN PATENT DOCUMENTS

| | | |
|---|---|---|
| JP | H10-65490 | 3/1983 |
| JP | H02-151113 A | 6/1990 |
| JP | 2000-323961 | 11/2000 |
| JP | 2002290204 A | 10/2002 |
| JP | 2003-530705 | 10/2003 |
| JP | 2004-129238 A | 4/2004 |
| JP | 2004135322 A | 4/2004 |
| JP | 2004-173245 A | 6/2004 |
| JP | 4053504 A | 2/2008 |
| JP | 2008-306359 A | 12/2008 |
| JP | 2009207116 A | 9/2009 |
| JP | 2014502803 A | 2/2014 |
| WO | 2010/058544 A1 | 4/2012 |
| WO | 2012/114930 A1 | 7/2014 |

OTHER PUBLICATIONS

Written Opinion issued in application No. PCT/JP2015/053169 dated Apr. 28, 2015.
Notice of Reason for Rejection issued in Japanese Patent Application No. 2015-561018 dated Aug. 8, 2017.

* cited by examiner

| COMMUNICATION BAND | FIRST BAND | SECOND BAND | THIRD BAND | FOURTH BAND |
|---|---|---|---|---|
| SELECTING PORTION SW1 | Psw1 | Psw1 | Psw3 | Psw3 |
| SELECTING PORTION SW2 | Psw2 | Psw2 | Psw4 | Psw4 |

FILTER CIRCUIT AND WIRELESS COMMUNICATION APPARATUS

This is a continuation of International Application No. PCT/JP2015/053169 filed on Feb. 5, 2015 which claims priority from Japanese Patent Application No. 2014-202077 filed on Sep. 30, 2014 and Japanese Patent Application No. 2014-023343 filed on Feb. 10, 2014. The contents of these applications are incorporated herein by reference in their entireties.

BACKGROUND

Technical Field

The present disclosure relates to a filter circuit having a pass band and a stop band, and to a wireless communication apparatus including the filter circuit.

Variable filter circuits have conventionally been used in wireless communication apparatuses in order to switch communication bands corresponding to transmission signals and reception signals. Such variable filter circuits have been given ladder configurations, in which basic circuits are configured by connecting variable capacitances in parallel or in series to resonators such as SAW resonators or BAW resonators and such basic circuits are then combined in multiple stages (see Patent Document 1, for example). In such a variable filter circuit, an anti-resonant frequency of each basic circuit is adjusted by controlling the variable capacitance connected in parallel to the resonator, and a resonant frequency of each basic circuit is adjusted by controlling both the variable capacitance connected in parallel and the variable capacitance connected in series to each resonator. Desired bands can be set as pass bands, stop bands, and so on as a result.

Patent Document 1: Japanese Patent No. 4053504

BRIEF SUMMARY

There are, among communication bands defined in various wireless communication standards, combinations in which frequency relationships between reception bands and transmission bands are inverted. For example, among LTE communication bands, the transmission band is further on the high-frequency side than the reception band in Band 20 (transmission band: 832-862 MHz; reception band: 791-821 MHz), and the transmission band is further on the low-frequency side than the reception band in Band 5 (transmission band: 824-849 MHz; reception band: 869-894 MHz). Accordingly, the frequency relationship between the reception bands and the transmission bands is inverted in a combination of Band 20 and Band 5, and it has been difficult to use frequency adjustment of the pass band of a variable filter circuit in order to switch communication bands in such a combination of communication bands.

Specifically, in the case where the variable filter circuit is used as a transmission filter, for example, it is necessary to achieve bandpass characteristics such that attenuation changes steeply between a pass band on the high-frequency side and a stop band on the low-frequency side in order for the variable filter circuit to handle the Band 20 transmission band. On the other hand, it is necessary to achieve bandpass characteristics such that attenuation changes steeply between a pass band on the low-frequency side and a stop band on the high-frequency side in order for the variable filter circuit to handle the Band 5 transmission band. However, it has been difficult to achieve such a bandpass characteristic switch with conventional variable filter circuits.

With the variable filter configuration illustrated in FIG. 1 of Patent Document 1, it has been necessary to provide resonators in each of parallel arms and serial arms of the variable filter circuit and at least four variable capacitances, and control each of the variable capacitances, to achieve bandpass characteristics in which attenuation characteristics are steep near the high-frequency side of the pass band, bandpass characteristics in which the attenuation characteristics are steep near the low-frequency side of the pass band, and so on. However, providing so many variable capacitances is problematic because doing so increases the circuit size and complicates the control system.

Accordingly, the present disclosure provides a filter circuit and a wireless communication apparatus capable of appropriately controlling the steepness of a change in attenuation near a pass band with ease, and that are capable of suppressing the circuit size from increasing and the control system from becoming complicated.

A filter circuit according to this disclosure includes a serial arm connected between a first input/output end and a second input/output end, a first parallel arm including a resonator connected in series between the first input/output end and a ground connection end, and a second parallel arm including a resonator connected in series between the second input/output end and the ground connection end.

The serial arm includes a switching circuit connected in series between the first input/output end and the second input/output end. The switching circuit has a plurality of reactance portions, and connects the reactance portions by switching among the plurality of reactance portions. By providing such a switching circuit between the first parallel arm and the second parallel arm, the steepness of a change in attenuation can be controlled near a high-frequency side of a pass band, near a low-frequency side of a pass band, and so on of the filter circuit by switching the reactance portions.

In the filter circuit according to this disclosure, the first and second parallel arms can include a variable reactance connected in series to the resonator. When a variable reactance is provided in this manner, a cutoff frequency on a low-frequency side of a pass band, a cutoff frequency on a high-frequency side of a pass band, and the like can be adjusted by controlling the variable reactance, while keeping the steepness high near the low-frequency side, near the high-frequency side, and so on of the pass band.

In the filter circuit according to this disclosure, at least one of the first and second parallel arms can further include a serial inductor connected in series to the resonator. Connecting a serial inductor to the resonator in this manner makes it possible to widen a range of variation of a frequency of the pass band by controlling the variable reactance. This also makes it possible to provide a first pass band on the low-frequency side and a second pass band on the high-frequency side.

Additionally, in the filter circuit according to this disclosure, at least one of the first and second parallel arms can further include a parallel inductor connected in parallel to the resonator. Connecting a parallel inductor to the resonator in this manner makes it possible to widen the range of variation of the frequency of the pass band by controlling the variable reactance.

The filter circuit according to this disclosure may be configured to include a parallel inductor connected in parallel to the resonator and a serial inductor connected in series to a circuit in which the resonator and the parallel inductor are connected in parallel. Alternatively, the filter circuit may be configured to include a serial inductor connected in series to the resonator and a parallel inductor connected in parallel to a circuit in which the resonator and the serial inductor are connected in series. Changing the connection configuration of the serial inductor and the parallel inductor in this manner makes it possible to make adjustments such as widening the range of variation of the cutoff frequency on the low-frequency side, the high-frequency side, and the like of the pass band and making attenuation characteristics steeper near the low-frequency side, near the high-frequency side, and so on of the pass band.

The filter circuit according to this disclosure may be configured so that each of the first parallel arm and the second parallel arm further includes a parallel inductor connected in parallel to the resonator, the first parallel arm includes a serial inductor connected in series to the resonator, and the second parallel arm does not include a serial inductor connected in series to the resonator. Employing such a configuration makes it possible to reduce the circuit size by an amount corresponding to omitting the serial inductor from the second parallel arm, as compared to a case where both the first parallel arm and the second parallel arm are provided with a serial inductor and a parallel inductor. In such a case, a resonance point and an anti-resonance point of the resonator included in the first parallel arm can be further on a high-frequency side than a resonance point and an anti-resonance point of the resonator included in the second parallel arm. Additionally, an inductance of the parallel inductor included in the second parallel arm can be lower than an inductance of the parallel inductor included in the first parallel arm. Doing so makes it possible to suppress a significant degradation in the filter characteristics of the variable filter circuit, a significant narrowing of the range of variation of the cutoff frequency, and so on, even if the serial inductor is omitted from the second parallel arm.

The filter circuit according to this disclosure may include the plurality of resonators and a resonator selecting portion that selects one of the plurality of resonators and connects the selected resonator in series to the variable reactance. Additionally, the filter circuit may be configured including a plurality of serial inductors, a plurality of parallel inductors, or the like, with the resonator selecting portion selecting one of these elements along with a resonator and connecting the selected element in series to the variable reactance. In such a case, having the respective resonators handle different communication bands makes it possible for the variable filter circuit to handle many communication bands, and makes it possible to select a communication band through control of the resonator selecting portion. Although it is normally necessary to provide substantially the same number of parallel arms as there are communication bands in order for the variable filter circuit to be capable of handling many communication bands, providing the resonator selecting portion as described above and selecting the resonator to connect to the variable reactance eliminates the need to provide a parallel arm for each communication band, and makes it possible to share a variable reactance among several communication bands. Accordingly, the total number of variable reactances can be suppressed, and an increase in the circuit size, complication of the variable reactance control, and the like can be suppressed.

A wireless communication apparatus according to this disclosure can include a front end circuit including the above-described filter circuit, an antenna, and a communication circuit connected to the antenna through the front end circuit. In particular, in the wireless communication apparatus, the communication circuit can handle a plurality of communication bands, and that an anti-resonance point in the case where at least one of the parallel arms does not include the variable reactance be higher than an upper limit frequency on a high-frequency side of a pass band of the communication band, among the plurality of communication bands, that is furthest on the high-frequency side. Additionally, a resonance point in the case where at least one of the parallel arms does not include the variable reactance can be lower than a lower limit frequency on a low-frequency side of a pass band of the communication band, among the plurality of communication bands, that is furthest on the low-frequency side.

It is necessary to provide a stop band and a pass band in each of the plurality of communication bands handled by the communication circuit. Setting the relationships between the resonance points and anti-resonance points of each parallel arm in the plurality of communication bands as described above makes it possible to adjust the cutoff frequency on the low-frequency side, the cutoff frequency on the high-frequency side, and so on in the pass band of the filter circuit to the low-frequency side, the high-frequency side, and so on of the pass bands of each of the plurality of communication bands handled by the communication circuit. Additionally, in the case where the stop band of the communication band is located near the low-frequency side, the high-frequency side, or the like of the pass band, the filter circuit can achieve a large attenuation with respect to that stop band.

Alternatively, in the wireless communication apparatus, the filter circuit can include a serial inductor connected in series to each of the resonators in the parallel arm, the communication circuit handle a plurality of communication bands, and a sub-resonance point in the case where at least one of the parallel arms does not include the variable reactance be lower than a lower limit frequency on a low-frequency side of a pass band of the communication band, among the plurality of communication bands, that is furthest on the low-frequency side.

When a serial inductor is connected to the resonator, a resonance point also appears further on the high-frequency side than the anti-resonance point of the resonator (called a sub-resonance point). In this case, in the bandpass characteristics, a second pass band arises on the high-frequency side in addition to the first pass band on the low-frequency side. The cutoff frequency on the low-frequency side, the cutoff frequency on the high-frequency side, and so on can be adjusted for the second pass band on the high-frequency side as well by controlling the capacitance of the variable reactance. Setting the relationship between the plurality of communication bands and the sub-resonance points in each parallel arm as described above makes it possible to adjust the second pass band on the high-frequency side of the filter circuit to the pass bands of the plurality of communication bands handled by the communication circuit.

The plurality of reactance portions according to this disclosure can include a first reactance portion having an inductive reactance. Additionally, the plurality of reactance portions according to this disclosure can include a second reactance portion having a capacitive reactance. Furthermore, the wireless communication apparatus can transmit and receive signals in a first communication band having a pass band further on the low-frequency side than a stop band when the first reactance portion is selected by the switching circuit. Additionally, the wireless communication apparatus can transmit and receive signals in a second communication band having a pass band further on the high-frequency side than a stop band when the second reactance portion is selected by the switching circuit. Through this, a change in attenuation near the high-frequency side of the pass band can be made steep when the first reactance portion is selected using the switching circuit. Likewise, a change in attenuation near the low-frequency side of the pass band can be made steep when the second reactance portion is selected using the switching circuit.

The first reactance portion according to this disclosure may be an inductor. Additionally, the second reactance portion according to this disclosure may be a capacitor.

The first reactance portion according to this disclosure may be a resonator. Additionally, the second reactance portion according to this disclosure may be a resonator. This makes it possible to improve the steepness of the filter characteristics as compared to a case where the first reactance portion, the second reactance portion, and the like are constituted of inductors, capacitors, or the like. It is also possible to configure the first reactance portion, the second reactance portion, and the like at small sizes.

Meanwhile, in the case where the first reactance portion is constituted of a resonator, a gap band between the pass band and the stop band of the communication band handled by the corresponding resonator can at least partially overlap with an inductive band between a resonance point and an anti-resonance point of that resonator. The gap band and the pass band at least partially overlap with an inductive region of the resonator. Particularly, the resonance point can overlap with the gap band. Through this, a part where the characteristics of the resonator change steeply can be used, and the filter characteristics can be made even steeper.

Meanwhile, in the case where the second reactance portion is constituted of a resonator, a gap band between the pass band and the stop band of the communication band handled by the corresponding resonator can overlap with a capacitive band further on the low-frequency side than the resonance point of the resonator or a capacitive band further on the high-frequency side than the anti-resonance point. The gap band and the pass band can overlap with a capacitive region of the resonator. In particular, the bands can overlap with a capacitive band further on the high-frequency side than the anti-resonance point of the resonator. By using a capacitive band further on the high-frequency side than the anti-resonance point, the bandpass characteristics of the resonator will overlap with the characteristics on the high-frequency side of an HPF attenuation pole, increasing the steepness of the cutoff. Additionally, by using a capacitive band further on the low-frequency side than the resonance point, a Q value of a capacitive reactance will be higher, improving the attenuation in the filter characteristics.

According to the present disclosure, by using a switching circuit, bandpass characteristics between a first input/output end and a second input/output end of a filter circuit can be switched, for example, to bandpass characteristics having a steep change in attenuation near a low-frequency side of a pass band and bandpass characteristics having a steep change in attenuation near a high-frequency side of a pass band. Furthermore, a number of resonators, variable reactances, and the like can be suppressed, which makes it possible to suppress an increase in the circuit size, complication of the control system, and so on more than has been possible with conventional configurations.

DETAILED DESCRIPTION

Figure 1:
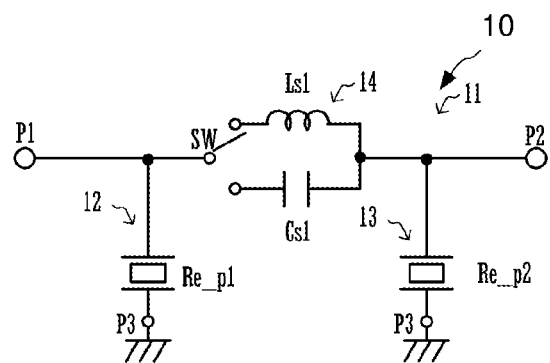
FIG. 1 is a circuit diagram illustrating a filter circuit and a wireless communication apparatus according to a first embodiment.

Several embodiments for carrying out the present disclosure will be described hereinafter with reference to the drawings, using several specific examples. Corresponding elements in the drawings are given the same reference numerals. It goes without saying that the embodiments are merely examples, and that configurations described in different embodiments can replace each other or be combined as well.

First Embodiment

FIG. 1 is a circuit diagram illustrating a filter circuit 10 according to a first embodiment of the present disclosure.

The filter circuit 10 includes ports P1, P2, and P3, a serial arm 11, and parallel arms 12 and 13. The port P1 is a first input/output end of the filter circuit 10. The port P2 is a second input/output end of the filter circuit 10. The port P3 is a ground connection end of the filter circuit 10. The serial arm 11 is connected in series between the port P1 and the port P2. The parallel arm 12 is connected in series between the port P1 and the port P3. The parallel arm 13 is connected in series between the port P2 and the port P3.

The serial arm 11 includes a switching circuit 14. The switching circuit 14 is connected in series between the port P1 and the port P2. The switching circuit 14 includes a switch SW, an inductor Ls1, and a capacitor Cs1. The switch SW selects one of the inductor Ls1 and the capacitor Cs1 and connects the selected element in series between the port P1 and the port P2. The inductor Ls1 corresponds to a first reactance portion. The capacitor Cs1 corresponds to a second reactance portion.

The parallel arm 12 includes a resonator Re_p1. One end of the resonator Re_p1 is connected to the port P1, and another end of the resonator Re_p1 is connected to the port P3. The parallel arm 13 includes a resonator Re_p2. One end of the resonator Re_p2 is connected to the port P2, and another end of the resonator Re_p2 is connected to the port P3. The elements, characteristics, and so on of the inductor Ls1, the capacitor Cs1, and the resonators Re_p1 and Re_p2 can be set as appropriate. Piezoelectric resonators such as SAW resonators or BAW resonators, dielectric coaxial resonators, LC resonance circuits, or the like can be used as the resonators Re_p1 and Re_p2.

The functions of the elements that constitute the filter circuit 10 will be described next.

Figure 2:
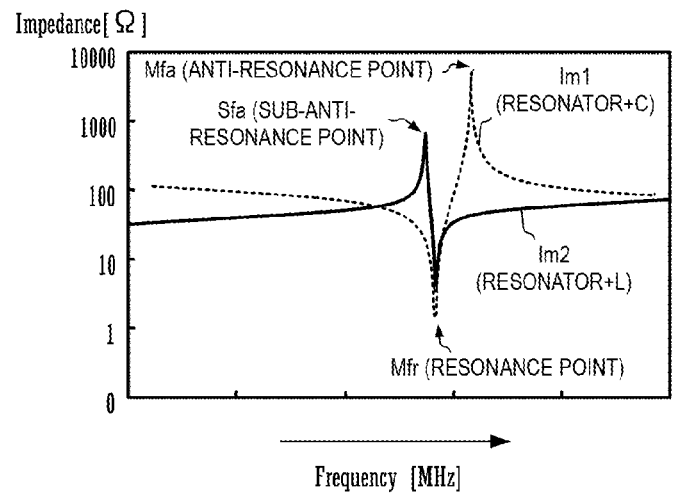
FIG. 2 is an impedance characteristic graph illustrating functions of an inductor and a capacitor that constitute the filter circuit according to the first embodiment.

FIG. 2 is an impedance characteristic graph illustrating functions of the inductor Ls1 and the capacitor Cs1 connected in the switching circuit 14. The dotted line in FIG. 2 schematically indicates impedance characteristics Im1 of the resonator Re_p1 in a state where the capacitor Cs1 is connected. The solid line in FIG. 2, meanwhile, schematically indicates impedance characteristics Im2 of the resonator Re_p1 in a state where the inductor Ls1 is connected.

Comparing the impedance characteristics Im1 of the resonator when the capacitor Cs1 is connected with the impedance characteristics Im2 of the resonator when the inductor Ls1 is connected, a frequency at a resonance point Mfr is the same, but an anti-resonance point Mfa has moved from a frequency near a high-frequency side of the resonance point Mfr and has newly appeared at a frequency near a low-frequency side of the resonance point Mfr. An anti-resonance point appearing at a frequency near the low-frequency side of the resonance point Mfr in this manner will be called a sub-anti-resonance point Sfa hereinafter.

Accordingly, the switching circuit 14 has a function of switching the anti-resonance point of the resonator Re_p1 of the parallel arm 12 to the low-frequency side or the high-frequency side of the resonance point Mfr. Note that the switching circuit 14 has the same function for the resonator Re_p2 of the parallel arm 13 as well.

Figure 3A:
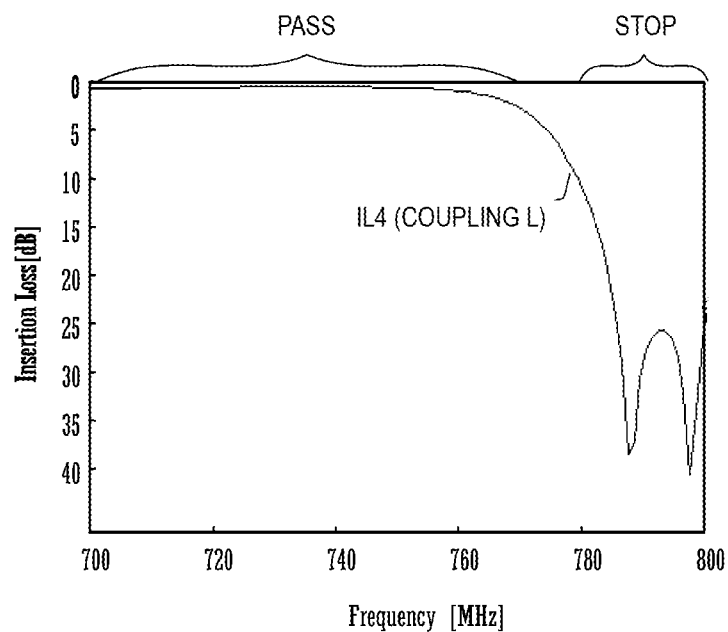
FIGS. 3A and 3B illustrate bandpass characteristic graphs of the filter circuit according to the first embodiment.
Figure 3B:
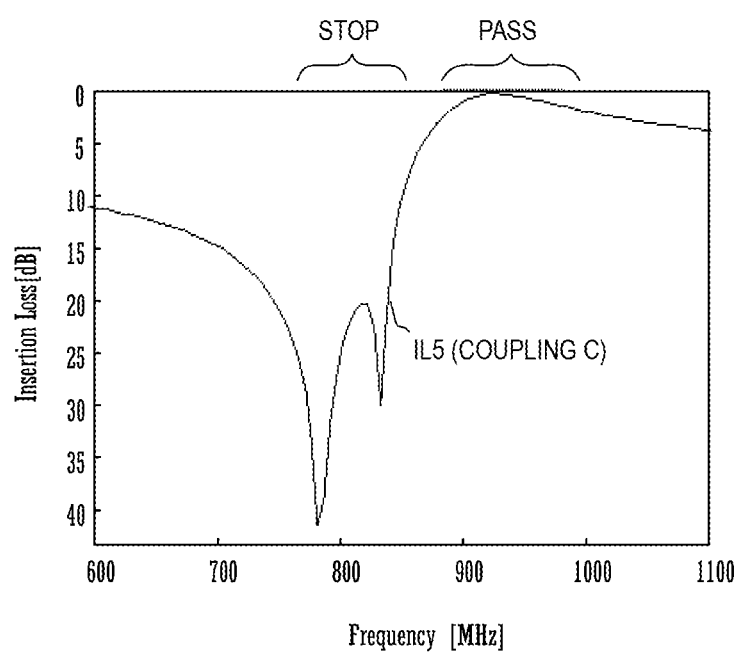

FIG. 3A is a bandpass characteristic graph of the filter circuit 10 in a state where the inductor Ls1 is connected in the switching circuit 14. FIG. 3B is a bandpass characteristic graph of the filter circuit 10 in a state where the capacitor Cs1 is connected in the switching circuit 14.

Here, both the resonator Re_p1 and the resonator Re_p2 are surface acoustic wave resonators. Additionally, two attenuation poles in FIGS. 3A and 3B correspond to the resonance points Mfr of the resonators Re_p1 and Re_p2, respectively.

As indicated in FIG. 3B, when the capacitor Cs1 is connected in the switching circuit 14, a desired pass band can be provided at a nearby frequency further on the high-frequency side than the two attenuation poles corresponding to the resonance points Mfr of the resonators Re_p1 and Re_p2, and attenuation characteristics change steeply near the low-frequency side of the pass band.

On the other hand, as illustrated in FIG. 3A, when the inductor Ls1 is connected in the switching circuit 14, a desired pass band can be provided at a nearby frequency further on the low-frequency side than the two attenuation poles corresponding to the resonance point Mfr of the resonator Re_p1 or the resonator Re_p2, and attenuation characteristics change steeply near the high-frequency side of the pass band.

In this manner, the bandpass characteristics of the filter circuit 10 are greatly affected depending on whether the inductor Ls1 or the capacitor Cs1 is connected in the switching circuit 14 because the anti-resonance point Mfa appears at a nearby frequency on the high-frequency side of the resonance point Mfr under the impedance characteristics Im1 arising in the case where the capacitor Cs1 is connected, and the sub-anti-resonance point Sfa appears at a nearby frequency on the low-frequency side of the resonance point Mfr under the impedance characteristics Im2 arising in the case where the inductor Ls1 is connected. The frequency at which the sub-anti-resonance point Sfa appears can be determined primarily by adjusting the inductance of the inductor Ls1.

As such, according to the filter circuit 10 of the present embodiment, the bandpass characteristics of the filter circuit 10 can be switched between bandpass characteristics having a steep change in attenuation near the high-frequency side of the pass band and bandpass characteristics having a steep change in attenuation near the low-frequency side of the pass band by the switch SW selecting and connecting the inductor Ls1 or selecting and connecting the capacitor Cs1 in the switching circuit 14.

In such filter characteristics, the number of stages of serial arms, parallel arms, and the like that constitute the filter may be increased in order to increase the steepness of the attenuation characteristics. For example, one each of a serial arm 14 and a parallel arm 15 may be newly added, with one end of the added serial arm 14 being connected to the port P1 or the port P2 and another end of the added serial arm 14 being connected to the parallel arm 15. At this time, a variable capacitance Cs_p3 of the added parallel arm 15 may be replaced with a fixed capacitance whose capacitance value does not change. Accordingly, even in the case where the variable filter circuit 10 is configured having n stages of serial arms, the total number of parallel arms and variable capacitances is a maximum of n+1, which makes it possible to suppress an increase in the circuit size and complication of the control system more than has been possible with conventional configurations. The variable filter circuit 10 according to the present embodiment may also be configured so that n+1 parallel arms and n serial arms are provided.

Second Embodiment

Figure 4:
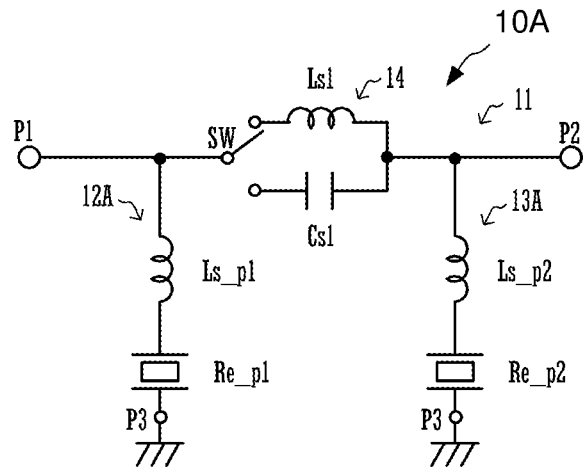
FIG. 4 is a circuit diagram of a filter circuit according to a second embodiment.

FIG. 4 is a circuit diagram illustrating a filter circuit 10A according to a second embodiment of the present disclosure.

The filter circuit 10A includes the ports P1, P2, and P3, the serial arm 11, and parallel arms 12A and 13A. The parallel arm 12A includes the resonator Re_p1 and a serial inductor Ls_p1. One end of the serial inductor Ls_p1 is connected to the port P1, and another end of the serial inductor Ls_p1 is connected to the resonator Re_p1. The parallel arm 13A includes the resonator Re_p2 and a serial inductor Ls_p2. One end of the serial inductor Ls_p2 is connected to the port P2, and another end of the serial inductor Ls_p2 is connected to the resonator Re_p2.

The functions of the serial inductors Ls_p1 and Ls_p2 that constitute the filter circuit 10A will be described next.

Figure 5:
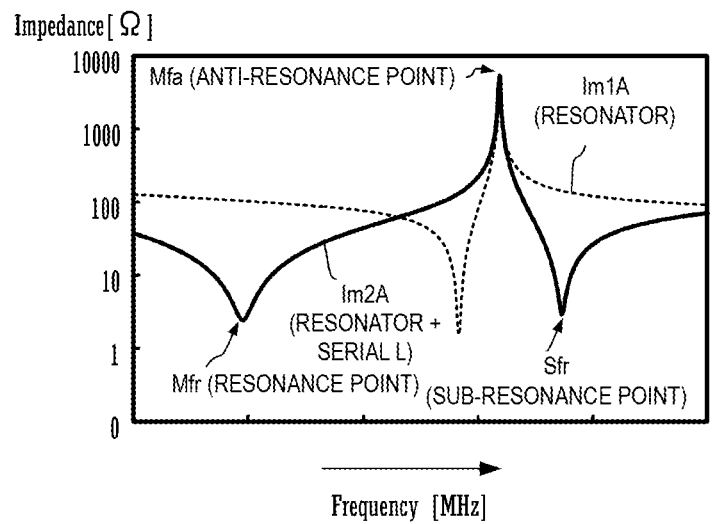
FIG. 5 is an impedance characteristic graph illustrating a function of a serial inductor that constitutes the filter circuit according to the second embodiment.

FIG. 5 is an impedance characteristic graph illustrating the function of the serial inductor Ls_p1 in the parallel arm 12A. The dotted line in FIG. 5 indicates impedance characteristics Im1A for the resonator Re_p1 alone. The solid line in FIG. 5, meanwhile, indicates impedance characteristics Im2A of the resonator Re_p1 in a state where the serial inductor Ls_p1 is connected.

Comparing the impedance characteristics Im2A when the serial inductor Ls_p1 is provided with the impedance characteristics Im1A when the serial inductor Ls_p1 is omitted, the frequency of the anti-resonance point Mfa is the same, but the frequency of the resonance point Mfr has moved to a lower frequency side in the impedance characteristics Im2A than in the impedance characteristics Im1A. Additionally, in the impedance characteristics Im2A, a sub-resonance point Sfr appears at a nearby frequency further on the high-frequency side than the anti-resonance point Mfa. The frequency at which the sub-resonance point Sfr appears can be determined primarily by adjusting the inductance of the inductor Ls_p1 or Ls_p2.

In this manner, the serial inductor Ls_p1 in the parallel arm 12A has a function of moving the resonance point Mfr to the low-frequency side and a function of producing the sub-resonance point Sfr further on the high-frequency side than the anti-resonance point Mfa. Note that the serial inductor Ls_p2 in the parallel arm 13A has the same function.

Figure 6A:
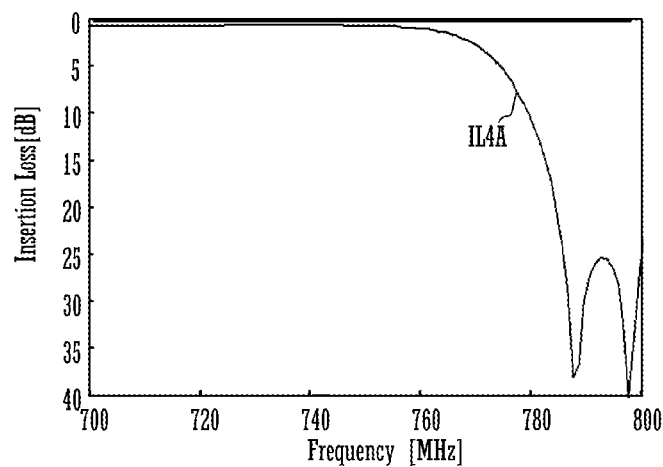
FIGS. 6A-6C illustrate bandpass characteristic graphs of the filter circuit according to the second embodiment.
Figure 6B:
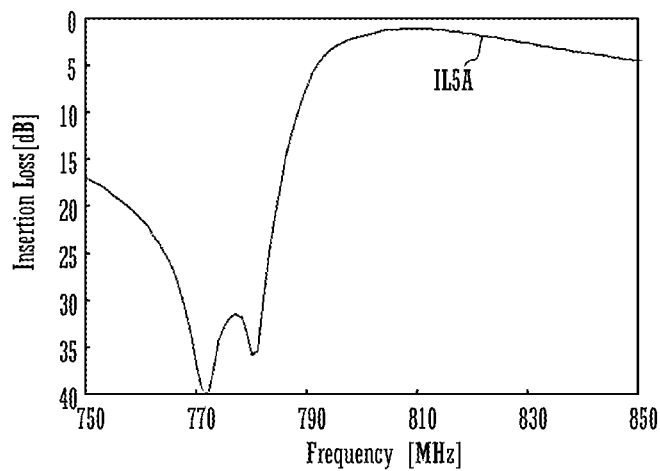
Figure 6C:
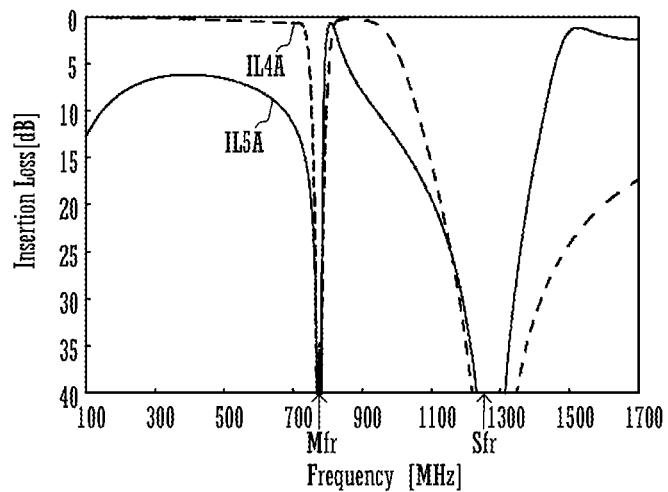

FIG. 6A is a bandpass characteristic graph of the filter circuit 10A in a state where the inductor Ls1 is selected in the switching circuit 14. FIG. 6B is a bandpass characteristic graph of the filter circuit 10A in a state where the capacitor Cs1 is selected in the switching circuit 14. FIG. 6C is a bandpass characteristic graph of the filter circuit 10A indicating a comparison between the state in which the inductor Ls1 is selected and the state in which the capacitor Cs1 is selected in the switching circuit 14. Two attenuation poles in FIGS. 6A and 6B correspond to the resonance points Mfr of the resonators Re_p1 and Re_p2, respectively.

As illustrated in FIG. 6A, when the inductor Ls1 is connected in the switching circuit 14, a first pass band can be provided at a nearby frequency further on the low-frequency side than the resonance point Mfr, and the attenuation characteristics near the high-frequency side of this first pass band change steeply. On the other hand, as illustrated in FIG. 6B, when the capacitor Cs1 is connected in the switching circuit 14, the first pass band can be provided at a nearby frequency further on the high-frequency side than the resonance point Mfr, and the attenuation characteristics near the low-frequency side of this first pass band change steeply.

Additionally, as illustrated in FIG. 6C, with bandpass characteristics IL4A in a state where the inductor Ls1 is connected, a second pass band located on the high-frequency side of the resonance point Mfr can be provided in addition to the aforementioned first pass band located on the low-frequency side of the resonance point Mfr. On the other hand, with bandpass characteristics IL5A in a state where the capacitor Cs1 is connected, the second pass band located on the high-frequency side of the anti-resonance point Mfa can be provided in addition to the aforementioned first pass band located on the high-frequency side of the resonance point Mfr and the low-frequency side of the anti-resonance point Mfa.

According to the filter circuit 10A described above as well, the bandpass characteristics of the filter circuit 10A can be switched between bandpass characteristics having a steep change in attenuation near the low-frequency side of the first pass band and bandpass characteristics having a steep change in attenuation near the high-frequency side of the first pass band by the switch SW selecting and connecting the inductor Ls1 or selecting and connecting the capacitor Cs1 in the switching circuit 14.

Additionally, according to the filter circuit 10A of the present embodiment, the second pass band can be provided further on the high-frequency side than the first pass band in the bandpass characteristics, both in the case where the inductor Ls1 is connected in the switching circuit 14 and in the case where the capacitor Cs1 is connected in the switching circuit 14.

Third Embodiment

Figure 7:
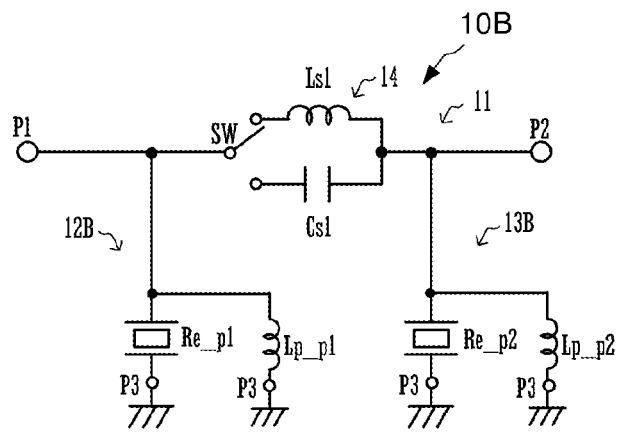
FIG. 7 is a circuit diagram of a filter circuit according to a third embodiment.

FIG. 7 is a circuit diagram illustrating a filter circuit 10B according to a third embodiment of the present disclosure.

The filter circuit 10B includes the ports P1, P2, and P3, the serial arm 11, and parallel arms 12B and 13B. The parallel arm 12B includes the resonator Re_p1 and a parallel inductor Lp_p1. One end of the parallel inductor Lp_p1 is connected to a connection point between the resonator Re_p1 and the port P1, and another end of the parallel inductor Lp_p1 is connected to the port P3. The parallel arm 13B includes the resonator Re_p2 and a parallel inductor Lp_p2. One end of the parallel inductor Lp_p2 is connected to a connection point between the resonator Re_p2 and the port P2, and another end of the parallel inductor Lp_p2 is connected to the port P3.

The functions of the parallel inductors Lp_p1 and Lp_p2 that constitute the filter circuit 10B will be described next.

Figure 8:
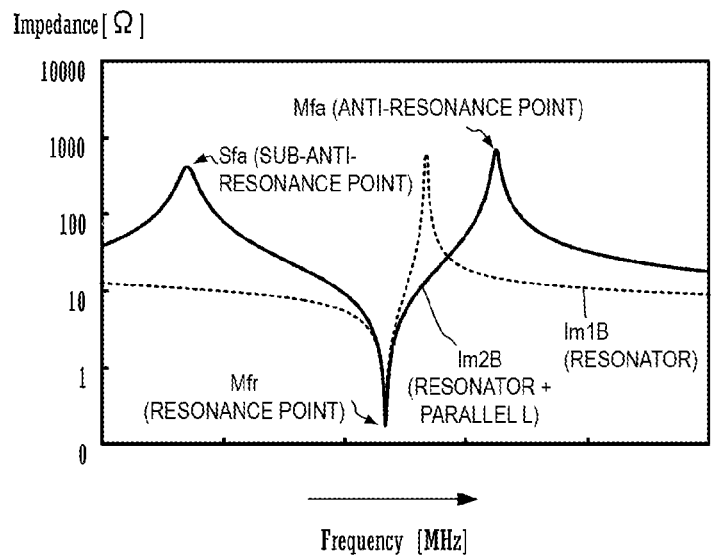
FIG. 8 is an impedance characteristic graph illustrating a function of a parallel inductor that constitutes the filter circuit according to the third embodiment.

FIG. 8 is an impedance characteristic graph illustrating the function of the parallel inductor Lp_p1 in the parallel arm 12B. The dotted line in FIG. 8 indicates impedance characteristics Im1B for the resonator Re_p1 alone. The solid line in FIG. 8, meanwhile, indicates impedance characteristics Im2B of the resonator Re_p1 in a state where the parallel inductor Lp_p1 is connected.

Comparing the impedance characteristics Im2B when the parallel inductor Lp_p1 is provided with the impedance characteristics Im1B when the parallel inductor Lp_p1 is omitted, the frequency of the resonance point Mfr is the same, but the frequency of the anti-resonance point Mfa has moved further to the high-frequency side in the impedance characteristics Im2B than in the impedance characteristics Im1B. Additionally, in the impedance characteristics Im2B, the sub-anti-resonance point Sfa appears at a nearby frequency further on the low-frequency side than the resonance point Mfr. The frequency at which the sub-anti-resonance point Sfa appears can be determined primarily by adjusting the inductance of the inductor Ls1, the inductor Lp_p1, or the inductor Lp_p2.

In this manner, the parallel inductor Lp_p1 in the parallel arm 12B has a function of moving the anti-resonance point Mfa to the high-frequency side and a function of producing the sub-anti-resonance point Sfa further on the low-frequency side than the resonance point Mfr. Note that the parallel inductor Lp_p2 in the parallel arm 13B has the same function.

According to the filter circuit 10B described above as well, the bandpass characteristics can be switched between bandpass characteristics having a steep change in attenuation near the low-frequency side of the first pass band and bandpass characteristics having a steep change in attenuation near the high-frequency side of the first pass band by the switch SW selecting and connecting the inductor Ls1 or selecting and connecting the capacitor Cs1 in the switching circuit 14.

<<First Variation>>

Figure 9:
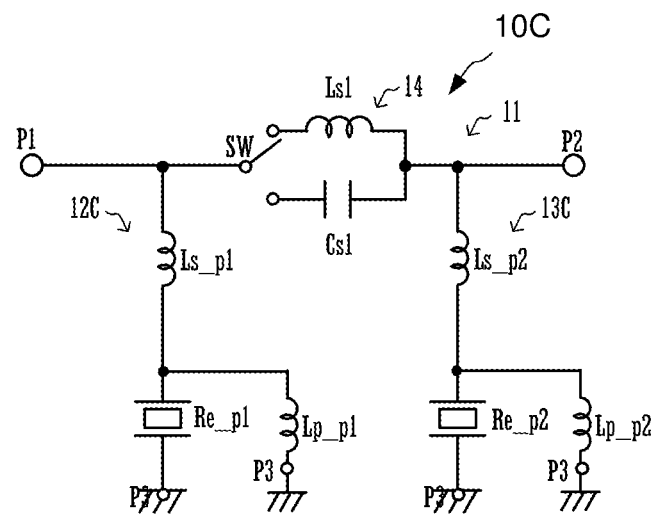
FIG. 9 is a circuit diagram of a filter circuit according to a first variation.

FIG. 9 is a circuit diagram illustrating a filter circuit 10C according to a first variation of the present disclosure.

The filter circuit 10C includes the ports P1, P2, and P3, a serial arm 11, and parallel arms 12C and 13C. The parallel arm 12C includes the resonator Re_p1, the serial inductor Ls_p1, and the parallel inductor Lp_p1. The parallel arm 13C includes the resonator Re_p2, the serial inductor Ls_p2, and the parallel inductor Lp_p2. In the present disclosure, both a serial inductor and a parallel inductor may be provided, as in the filter circuit 10C according to this variation.

Although the parallel inductors Lp_p1 and Lp_p2 are connected at one end to connection points between the resonators Re_p1 and Re_p2 and the serial inductors Ls_p1 and Ls_p2, respectively, in the present variation, the parallel inductors Lp_p1 and Lp_p2 may be connected at one end to connection points between the serial inductors Ls_p1 and Ls_p2 and the ports P1 and P2, respectively.

Fourth Embodiment

Figure 10A:
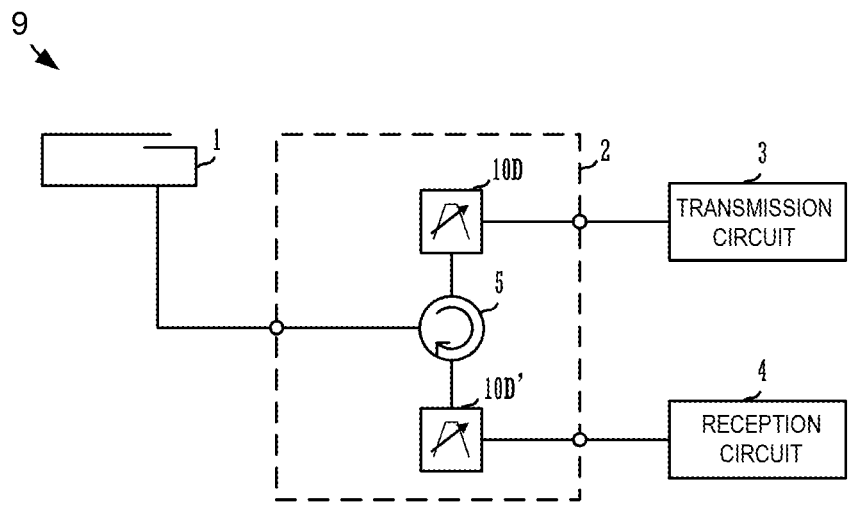
FIGS. 10A and 10B include circuit diagrams illustrating a wireless communication apparatus and a filter circuit according to a fourth embodiment.

FIG. 10A is a block diagram illustrating a wireless communication apparatus 9 according to a fourth embodiment.

The wireless communication apparatus 9 includes an antenna 1, a front end circuit 2, a transmission circuit 3, and a reception circuit 4. The transmission circuit 3 is configured to be capable of handling a plurality of communication bands in a communication system such as LTE, and outputs a transmission signal having switched to a corresponding communication band. The reception circuit 4 is configured to be capable of handling a plurality of communication bands in a communication system such as LTE, and accepts the input of a reception signal having switched to a corresponding communication band. The front end circuit 2 is connected between the antenna 1, and the transmission circuit 3 and reception circuit 4, and includes a filter circuit 10D connected to the transmission circuit 3, a filter circuit 10D' connected to the reception circuit 4, and a circulator 5. The circulator 5 is given directionality with respect to a propagation direction of signals, so that the transmission signal propagates from the transmission circuit 3 to the antenna 1 and the reception signal propagates from the antenna 1 to the reception circuit 4.

Figure 10B:
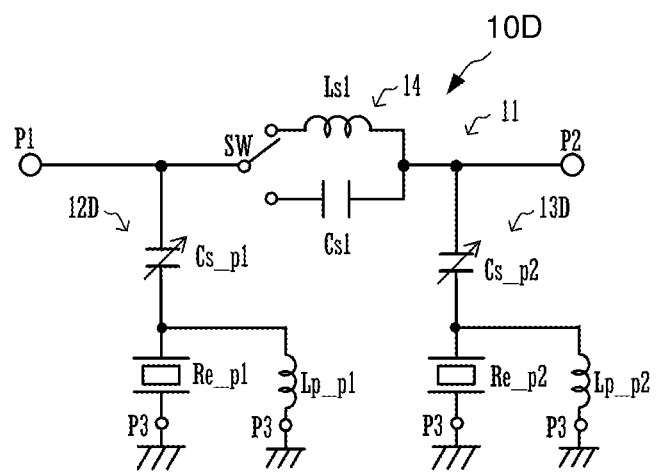

FIG. 10B is a circuit diagram illustrating the filter circuit 10D. Note that the filter circuit 10D' has the same configuration as the filter circuit 10D.

The filter circuit 10D includes the ports P1, P2, and P3, the serial arm 11, and parallel arms 12D and 13D. The parallel arm 12D includes the resonator Re_p1, the parallel inductor Lp_p1, and a variable capacitance Cs_p1. One end of the variable capacitance Cs_p1 is connected to the port P1. The resonator Re_p1 is connected between another end of the variable capacitance Cs_p1 and the port P3. One end of the parallel inductor Lp_p1 is connected to a connection point between the variable capacitance Cs_p1 and the resonator Re_p1, and another end of the parallel inductor Lp_p1 is connected to the port P3. The parallel arm 13D includes the resonator Re_p2, the parallel inductor Lp_p2, and a variable capacitance Cs_p2. One end of the variable capacitance Cs_p2 is connected to the port P2. The resonator Re_p2 is connected between another end of the variable capacitance Cs_p2 and the port P3. One end of the parallel inductor Lp_p2 is connected to a connection point between the variable capacitance Cs_p2 and the resonator Re_p2, and another end of the parallel inductor Lp_p2 is connected to the port P3.

Figure 11:
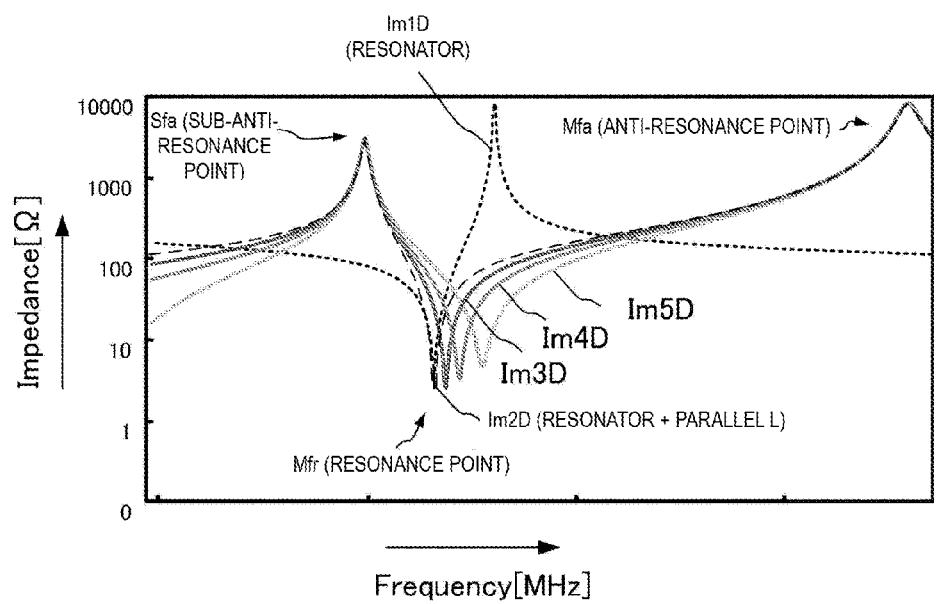
FIG. 11 is an impedance characteristic graph illustrating a function of a variable capacitance that constitutes the filter circuit according to the fourth embodiment.

FIG. 11 is an impedance characteristic graph illustrating the function of the variable capacitance Cs_p1 in the parallel arm 12D. The dotted line in FIG. 11 indicates impedance characteristics Im1D for the resonator Re_p1 alone. The broken line in FIG. 11, meanwhile, indicates impedance characteristics Im2D of the resonator Re_p1 in a state where the parallel inductor Lp_p1 is connected. The solid lines in FIG. 11 indicate impedance characteristics Im3D, Im4D, and Im5D of the resonator Re_p1 in a state where the parallel inductor Lp_p1 and the variable capacitance Cs_p1 are connected. The impedance characteristics Im3D, Im4D, and Im5D are impedance characteristics arising when the capacitance of the variable capacitance Cs_p1 is set to become progressively smaller in the indicated order within a range of 1.0 pF to 10.0 pF.

Comparing the impedance characteristics Im1D when the parallel inductor Lp_p1 and the variable capacitance Cs_p1 are omitted with the impedance characteristics Im2D when the parallel inductor Lp_p1 is provided but the variable capacitance Cs_p1 is omitted, the frequency of the resonance point Mfr is the same, but the frequency of the anti-resonance point Mfa has moved to a higher frequency in the impedance characteristics Im2D than in the impedance characteristics Im1D, and there is a wider frequency band between the resonance point Mfr and the anti-resonance point Mfa. Additionally, in the impedance characteristics Im2D, the sub-anti-resonance point Sfa appears at a nearby frequency further on the low-frequency side than the resonance point Mfr.

Additionally, comparing the impedance characteristics Im2D when the parallel inductor Lp_p1 is provided but the variable capacitance Cs_p1 is omitted with the impedance characteristics Im3D, Im4D, and Im5D in which the parallel inductor Lp_p1 and the variable capacitance Cs_p1 are provided, the frequency of the anti-resonance point Mfa and the frequency of the sub-anti-resonance point Sfa are the same in each of the impedance characteristics Im2D, Im3D, Im4D, and Im5D, but the frequency of the resonance point Mfr is higher in the impedance characteristics Im3D, Im4D, and Im5D than in the impedance characteristics Im2D. Furthermore, the frequency of the resonance point Mfr approaches the anti-resonance point Mfa and is located further on the high-frequency side as the capacitance of the variable capacitance Cs_p1 drops.

In this manner, the variable capacitance Cs_p1 in the parallel arm 12D has a function of moving the resonance point Mfr of the resonator Re_p1 to the high-frequency side in accordance with the capacitance. Note that the variable capacitance Cs_p2 in the parallel arm 13D also has a function of moving the resonance point Mfr of the resonator Re_p2 to the high-frequency side in accordance with the capacitance.

Figure 12A:
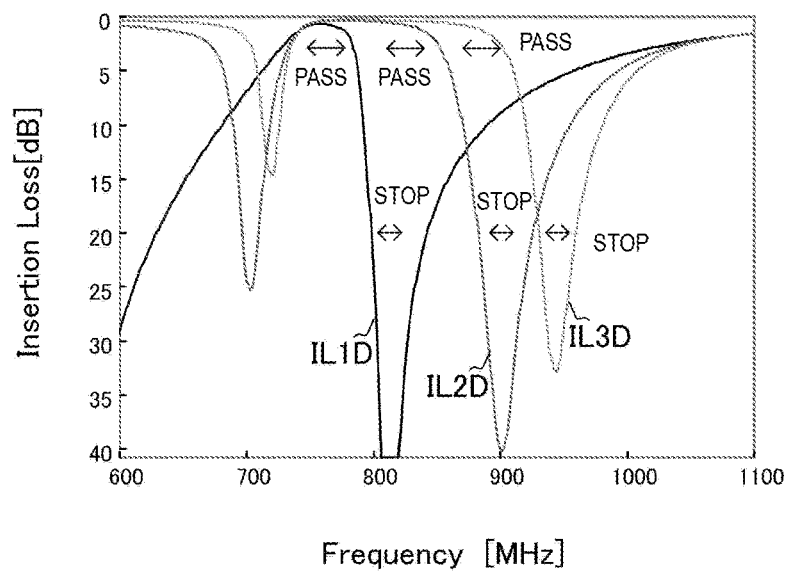
FIGS. 12A and 12B illustrate bandpass characteristic graphs of the filter circuit according to the fourth embodiment.

FIG. 12A is a bandpass characteristic graph of the filter circuit 10D in a state where the inductor Ls1 is selected in the switching circuit 14. The solid lines in FIG. 12A correspond to bandpass characteristics IL1D, IL2D, and IL3D. The bandpass characteristics IL1D are bandpass characteristics arising in the case where the variable capacitances Cs_p1 and Cs_p2 are controlled to approximately 10.0 pF. The bandpass characteristics IL2D are bandpass characteristics arising in the case where the variable capacitances Cs_p1 and Cs_p2 are controlled to approximately 5.0 pF. The bandpass characteristics IL3D are bandpass characteristics arising in the case where the variable capacitances Cs_p1 and Cs_p2 are controlled to approximately 2.0 pF.

According to the bandpass characteristics IL1D, IL2D, and IL3D in a state where the inductor Ls1 is connected in the switching circuit 14, a cutoff frequency on the high-frequency side of the pass band is successfully adjusted in a band of approximately 150 MHz (800 to 950 MHz) by controlling the capacitances of the variable capacitances Cs_p1 and Cs_p2. As the capacitances of the variable capacitances Cs_p1 and Cs_p2 decrease, the cutoff frequency on the high-frequency side of the pass band moves to the high-frequency side and the band width of the pass band increases. The steepness of the change in attenuation near the high-frequency side of the pass band is maintained even if the variable capacitances Cs_p1 and Cs_p2 are controlled.

Figure 12B:
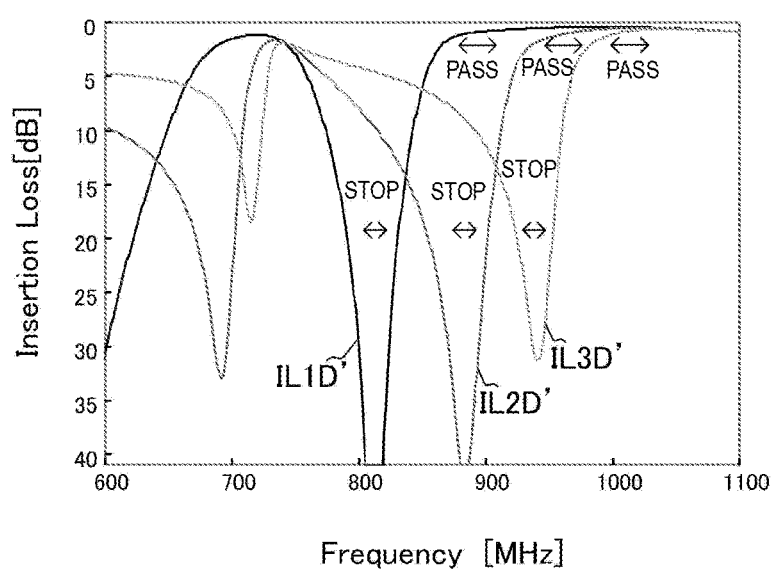

FIG. 12B is a bandpass characteristic graph of the filter circuit 10D in a state where the capacitor Cs1 is selected in the switching circuit 14. The solid lines in FIG. 12B correspond to bandpass characteristics IL1D', IL2D', and IL3D'. The bandpass characteristics IL1D' are bandpass characteristics arising in the case where the variable capacitances Cs_p1 and Cs_p2 are controlled to approximately 10.0 pF. The bandpass characteristics IL2D' are bandpass characteristics arising in the case where the variable capacitances Cs_p1 and Cs_p2 are controlled to approximately 5.0 pF. The bandpass characteristics IL3D' are bandpass characteristics arising in the case where the variable capacitances Cs_p1 and Cs_p2 are controlled to approximately 2.0 pF.

According to the bandpass characteristics IL1D', IL2D', and IL3D' in a state where the capacitor Cs1 is connected in the switching circuit 14, a cutoff frequency on the low-frequency side of the pass band is successfully adjusted in a band of approximately 150 MHz (800 to 950 MHz) by controlling the capacitances of the variable capacitances Cs_p1 and Cs_p2. As the capacitances of the variable capacitances Cs_p1 and Cs_p2 decrease, the cutoff frequency on the low-frequency side of the pass band moves to the high-frequency side. The steepness of the change in attenuation near the low-frequency side of the pass band is maintained even if the variable capacitances Cs_p1 and Cs_p2 are controlled.

However, the cutoff frequencies on the high-frequency side, the low-frequency side, and so on of the pass band cannot be adjusted to the high-frequency side beyond a predetermined frequency even if the capacitances of the variable capacitances Cs_p1 and Cs_p2 have been controlled to an extremely low value. This is because the frequency of the resonance point Mfr cannot be adjusted to the high-frequency side beyond the frequency of the anti-resonance point Mfa, and a range of variation of the cutoff frequency on the high-frequency side, the low-frequency side, and so on of the pass band is limited to a band between the resonance point Mfr and the anti-resonance point Mfa arising in a case where the variable capacitances Cs_p1 and Cs_p2 are omitted. However, when the serial inductors Ls_p1 and Ls_p2, the parallel inductors Lp_p1 and Lp_p2, and so on are provided as described above, the band between the resonance point Mfr and the anti-resonance point Mfa can be widened more than in the case where the serial inductors Ls_p1 and Ls_p2, the parallel inductors Lp_p1 and Lp_p2, and so on are not provided, and thus the filter circuit 10D can widen the range of variation of the cutoff frequency on the high-frequency side, the low-frequency side, and so on of the pass band.

According to the wireless communication apparatus 9 including such filter circuits 10D and 10D', when using a communication band in which the transmission band is on a low-frequency side and the reception band is on a high-frequency side (LTE Band 20, for example), the inductor Ls1 is connected by controlling the switch SW of the filter circuit 10D and the capacitor Cs1 is connected by controlling the switch SW of the filter circuit 10D', after which the variable capacitances Cs_p1 and Cs_p2 of the filter circuits 10D and 10D', respectively, are controlled. Accordingly, the filter circuit 10D can be given bandpass characteristics in which the transmission band on the low-frequency side is set as a pass band and a reception band on the high-frequency side is set as a stop band, and the filter circuit 10D' can be given bandpass characteristics in which the reception band on the high-frequency side is set as a pass band and the transmission band on the low-frequency side is set as a stop band.

Conversely, in the wireless communication apparatus 9, when using a communication band in which the transmission band is on a high-frequency side and the reception band is on a low-frequency side (LTE Band 5, for example), the capacitor Cs1 is connected by controlling the switch SW of the filter circuit 10D and the inductor Ls1 is connected by controlling the switch SW of the filter circuit 10D', after which the variable capacitances Cs_p1 and Cs_p2 of the filter circuits 10D and 10D', respectively, are controlled. Accordingly, the filter circuit 10D can be given bandpass characteristics in which the transmission band on the high-frequency side is set as a pass band and a reception band on the low-frequency side is set as a stop band, and the filter circuit 10D' can be given bandpass characteristics in which the reception band on the low-frequency side is set as a pass band and the transmission band on the high-frequency side is set as a stop band.

As described thus far, according to the filter circuit 10D, the bandpass characteristics can be switched between bandpass characteristics having a steep change in attenuation near the high-frequency side of the pass band and bandpass characteristics having a steep change in attenuation near the low-frequency side of the pass band by the switch SW selecting and connecting the inductor Ls1 or selecting and connecting the capacitor Cs1 in the switching circuit 14. Additionally, according to the filter circuit 10D of the present embodiment, providing the variable capacitances Cs_p1 and Cs_p2 makes it possible to adjust the cutoff frequency on the high-frequency side, the low-frequency side, and so on of the pass band.

As such, according to the filter circuit 10D, bandpass characteristics corresponding to a plurality of communication bands, including a communication band in which a frequency relationship between the transmission band and the reception band is inverted relative to another communication band, can be achieved by controlling the switching circuit 14 and the variable capacitances Cs_p1 and Cs_p2. Additionally, the parallel inductors Lp_p1 and Lp_p2 are provided, and thus the range of variation of the cutoff frequency on the high-frequency side, the low-frequency side, and the like of the pass band that can be adjusted by controlling the variable capacitances Cs_p1 and Cs_p2 can be made wider.

Although this embodiment describes an example in which a variable capacitance is used as a variable reactance, an element aside from a variable capacitance may be used as the variable reactance. For example, an element or circuit that functions as a variable inductor, a variable reactance circuit including a switching means such as a switch, or the like may be used.

Fifth Embodiment

Figure 13:
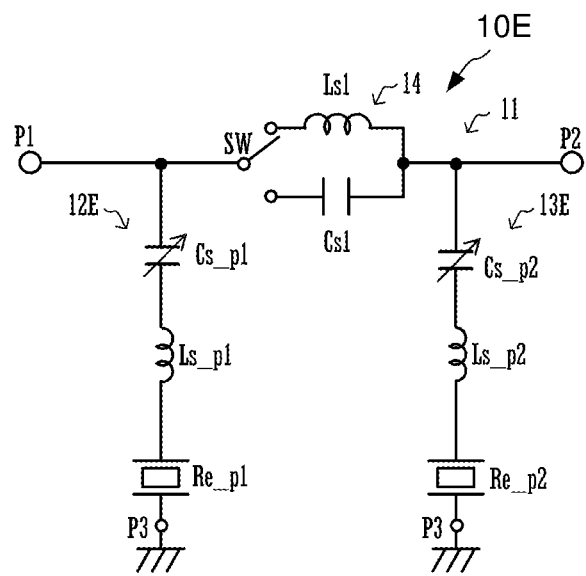
FIG. 13 is a circuit diagram of a filter circuit according to a fifth embodiment.

FIG. 13 is a circuit diagram illustrating a filter circuit 10E according to a fifth embodiment.

The filter circuit 10E includes ports P1, P2, and P3, a serial arm 11, and parallel arms 12E and 13E. The parallel arm 12E includes the resonator Re_p1, the serial inductor Ls_p1, and the variable capacitance Cs_p1. One end of the variable capacitance Cs_p1 is connected to the port P1. One end of the resonator Re_p1 is connected to the port P3. The serial inductor Ls_p1 is connected between the variable capacitance Cs_p1 and the resonator Re_p1. Another end of the variable capacitance Cs_p1 and another end of the resonator Re_p1 are connected to each other. The parallel arm 13E includes the resonator Re_p2, the serial inductor Ls_p1, and the variable capacitance Cs_p2. One end of the variable capacitance Cs_p2 is connected to the port P2. One end of the resonator Re_p2 is connected to the port P3. The serial inductor Ls_p2 is connected between the variable capacitance Cs_p2 and the resonator Re_p2.

Figure 14A:
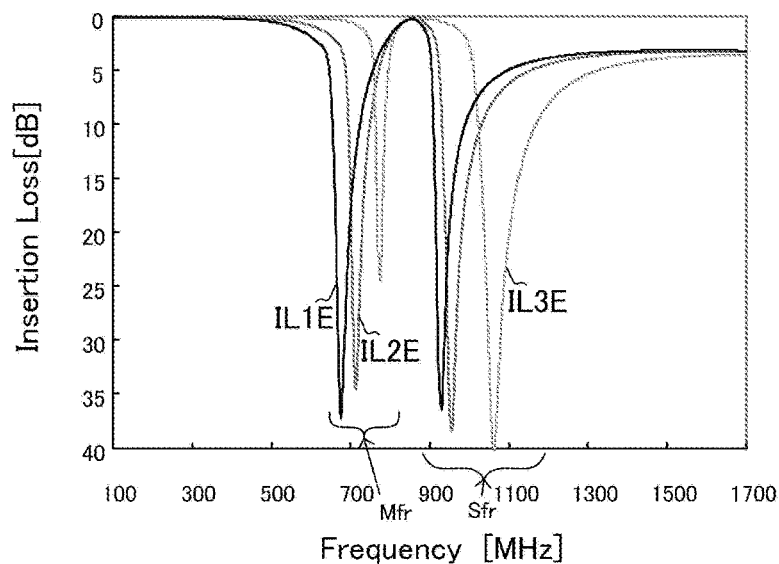
FIGS. 14A and 14B illustrate characteristic graphs of a filter circuit according to the fifth embodiment.

FIG. 14A is a bandpass characteristic graph of the filter circuit 10E in a state where the inductor Ls1 is selected in the switching circuit 14. The solid lines in FIG. 14A correspond to bandpass characteristics IL1E, IL2E, and IL3E. The bandpass characteristics IL1E are bandpass characteristics arising in the case where the variable capacitances Cs_p1 and Cs_p2 are controlled to approximately 10.0 pF. The bandpass characteristics IL2E are bandpass characteristics arising in the case where the variable capacitances Cs_p1 and Cs_p2 are controlled to approximately 3.0 pF. The bandpass characteristics IL3E are bandpass characteristics arising in the case where the variable capacitances Cs_p1 and Cs_p2 are controlled to approximately 2.0 pF.

In the filter circuit 10E provided with the serial inductors Ls_p1 and Ls_p2, each of the bandpass characteristics IL1E, IL2E, and IL3E has a first pass band further on the low-frequency side than the resonance point Mfr and a second pass band further on the high-frequency side than the resonance point Mfr. The cutoff frequency on the high-frequency side is successfully adjusted for the first pass band and the second pass band by controlling the capacitances of the variable capacitances Cs_p1 and Cs_p2, respectively. The cutoff frequency on the high-frequency side of the first pass band is successfully adjusted in a band of approximately 100 MHz (680 to 780 MHz). Likewise, the cutoff frequency on the high-frequency side of the second pass band is successfully adjusted in a band of approximately 150 MHz (920 to 1070 MHz). The steepness of the change in attenuation near the high-frequency side of the first pass band is also maintained even if the variable capacitances Cs_p1 and Cs_p2 are controlled. Likewise, the steepness of the change in attenuation near the high-frequency side of the second pass band is also maintained even if the variable capacitances Cs_p1 and Cs_p2 are controlled.

Figure 14B:
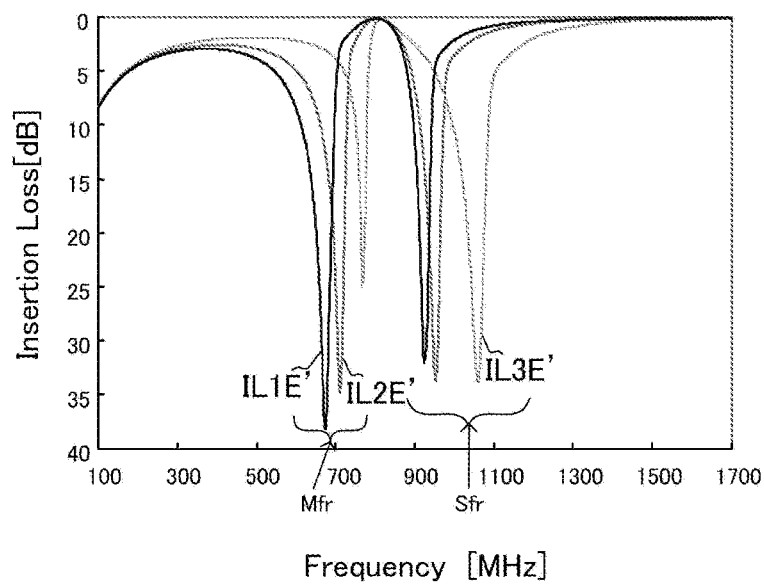

FIG. 14B is a bandpass characteristic graph of the filter circuit 10E in a state where the capacitor Cs1 is selected in the switching circuit 14. The solid lines in FIG. 14B correspond to bandpass characteristics IL1E', IL2E', and IL3E'. The bandpass characteristics IL1E' are bandpass characteristics arising in the case where the variable capacitances Cs_p1 and Cs_p2 are controlled to approximately 10.0 pF. The bandpass characteristics IL2E' are bandpass characteristics arising in the case where the variable capacitances Cs_p1 and Cs_p2 are controlled to approximately 3.5 pF. The bandpass characteristics IL3E' are bandpass characteristics arising in the case where the variable capacitances Cs_p1 and Cs_p2 are controlled to approximately 2.0 pF.

Here as well, providing the serial inductors Ls_p1 and Ls_p2 results in a first pass band arising further on the high-frequency side than the resonance point Mfr and further on the low-frequency side than the sub-resonance point Sfr and a second pass band arising further on the high-frequency side than the sub-resonance point Sfr in each of the bandpass characteristics IL1E', IL2E', and IL3E'. The cutoff frequency on the low-frequency side is successfully adjusted for the first pass band and the second pass band by controlling the capacitances of the variable capacitances Cs_p1 and Cs_p2, respectively. The cutoff frequency on the low-frequency side of the first pass band is successfully adjusted in a band of approximately 100 MHz (680 to 780 MHz). Likewise, the cutoff frequency on the low-frequency side of the second pass band is successfully adjusted in a band of approximately 150 MHz (920 to 1070 MHz). The steepness of the change in attenuation near the low-frequency side of the first pass band is also maintained even if the variable capacitances Cs_p1 and Cs_p2 are controlled. Likewise, the steepness of the change in attenuation near the low-frequency side of the second pass band is also maintained even if the variable capacitances Cs_p1 and Cs_p2 are controlled.

In this manner, according to the filter circuit 10E as well, the bandpass characteristics can be switched between bandpass characteristics having a steep change in attenuation near the high-frequency side of the first and second pass bands and bandpass characteristics having a steep change in attenuation near the low-frequency side of the first and second pass bands by the switch SW selecting and connecting the inductor Ls1 or selecting and connecting the capacitor Cs1 in the switching circuit 14. Additionally, according to the filter circuit 10E of the present embodiment, providing the variable capacitances Cs_p1 and Cs_p2 makes it possible to adjust the cutoff frequency on the high-frequency side, the low-frequency side, and so on of the first and second pass bands. Additionally, the serial inductors Ls_p1 and Ls_p2 are provided, and thus the range of variation of the cutoff frequency on the high-frequency side, the low-frequency side, and the like of the pass band that can be adjusted by controlling the variable capacitances Cs_p1 and Cs_p2 can be made wider.

Note that in a variable filter circuit that makes the cutoff frequency on the high-frequency side, the low-frequency side, or the like of a pass band variable by providing the variable capacitances Cs_p1 and Cs_p2, as is the case with the filter circuit 10E, it is necessary for the filter circuit 10E to meet the following first requirement and second requirement in the case where, for a plurality of corresponding communication bands of a wireless communication apparatus, one of a transmission signal and a reception signal is allowed to pass and the other is stopped in correspondence with the first pass band on the low-frequency side.

The first requirement is that in at least one parallel arm, the anti-resonance point (Mfa) in the case where there is no variable capacitance is at a frequency that is higher than an upper limit frequency on the high-frequency side of the pass band of the communication band, among the plurality of communication bands, that furthest on the high-frequency side. Meanwhile, the second requirement is that in at least one parallel arm, the resonance point (Mfr) in the case where there is no variable capacitance is at a frequency that is lower than a lower limit frequency on the low-frequency side of the pass band of the communication band, among the plurality of communication bands, that is furthest on the low-frequency side. If the first requirement and the second requirement are met, the plurality of communication bands are all contained within the band from the resonance point (Mfr) to the anti-resonance point (Mfa), and thus the cutoff frequency on the high-frequency side, the low-frequency side, or the like of the pass band can be adjusted to a frequency between the pass band and stop band in each of the plurality of communication bands by controlling the variable capacitances Cs_p1 and Cs_p2.

Additionally, in a variable filter circuit, it is necessary for the following requirement to be met in the case where, for a plurality of corresponding communication bands of a wireless communication apparatus, one of a transmission signal and a reception signal is allowed to pass and the other is stopped in correspondence with the second pass band on the high-frequency side.

In other words, in at least one parallel arm, the sub-resonance point (Sfr) in the case where there is no variable capacitance is at a frequency that is lower than a lower limit frequency on the low-frequency side of the pass band of the communication band, among the plurality of communication bands, that is furthest on the low-frequency side. If the variable filter circuit meets such a requirement, the plurality of communication bands are all contained within a band higher than the sub-resonance point (Sfr), and thus the cutoff frequency on the high-frequency side, the low-frequency side, or the like of the second pass band on the high-frequency side can be adjusted to a frequency between the pass band and stop band in each of the plurality of communication bands by controlling the variable capacitances Cs_p1 and Cs_p2.

<<Second Variation>>

Figure 15:
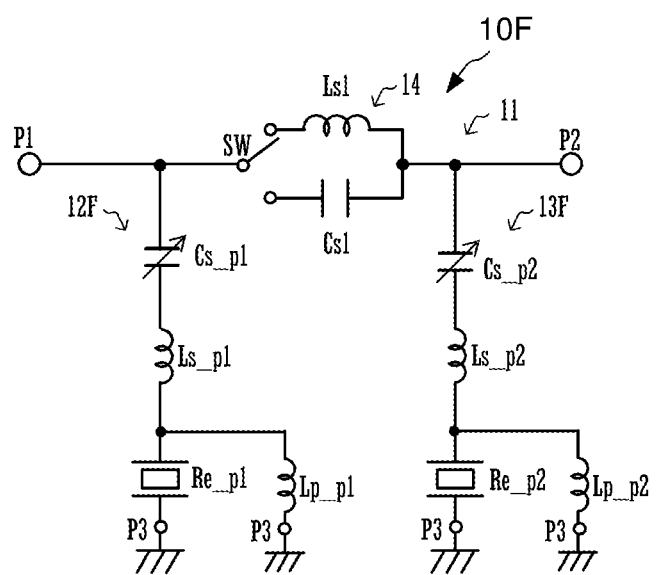
FIG. 15 is a circuit diagram of a filter circuit according to a second variation.

FIG. 15 is a circuit diagram illustrating a filter circuit 10F according to a second variation.

The filter circuit 10F includes the ports P1, P2, and P3, the serial arm 11, and parallel arms 12F and 13F. The parallel arm 12F includes the resonator Re_p1, the serial inductor Ls_p1, the parallel inductor Lp_p1, and the variable capacitance Cs_p1. One end of the variable capacitance Cs_p1 is connected to the port P1. One end of the resonator Re_p1 is connected to the port P3. The serial inductor Ls_p1 is connected in series between the variable capacitance Cs_p1 and the resonator Re_p1. One end of the parallel inductor Lp_p1 is connected to a connection point between the serial inductor Ls_p1 and the resonator Re_p1, and another end of the parallel inductor Lp_p1 is connected to the port P3.

The parallel arm 13F includes the resonator Re_p2, the serial inductor Ls_p2, the parallel inductor Lp_p2, and the variable capacitance Cs_p2. One end of the variable capacitance Cs_p2 is connected to the port P2. One end of the resonator Re_p2 is connected to the port P3. The serial inductor Ls_p2 is connected in series between the variable capacitance Cs_p2 and the resonator Re_p2. One end of the parallel inductor Lp_p2 is connected to a connection point between the serial inductor Ls_p2 and the resonator Re_p2, and another end of the parallel inductor Lp_p2 is connected to the port P3. In the present disclosure, a serial inductor and a parallel inductor may both be provided, as is the case with the filter circuit 10F according to this variation, and doing so makes it possible to widen the range of variation of the cutoff frequency that can be adjusted by controlling the variable capacitance Cs_p1.

<<Third Variation>>

Figure 16A:
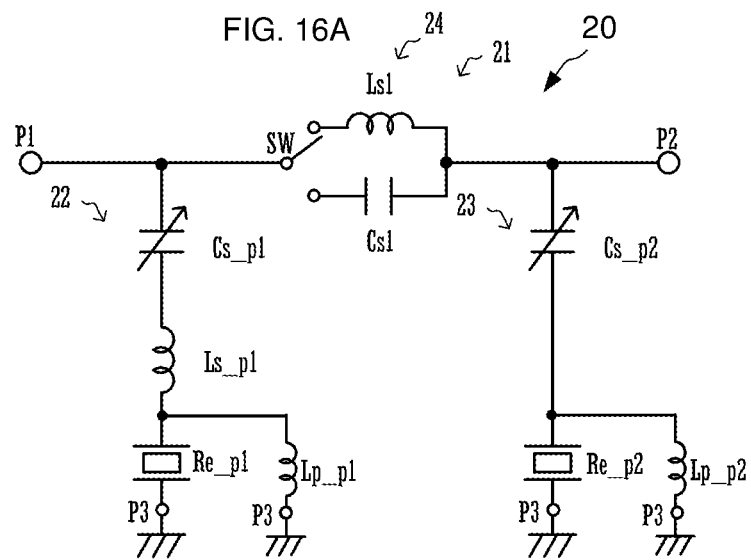
FIGS. 16A-16C include diagrams illustrating a variable filter circuit according to a third variation.

FIG. 16A is a circuit diagram illustrating a filter circuit 20 according to a third variation.

The filter circuit 20 includes a serial arm 21 and parallel arms 22 and 23. As in the above variations, the parallel arm 22 includes the variable capacitance Cs_p1 and the resonator Re_p1. The parallel arm 23 includes the variable capacitance Cs_p2 and the resonator Re_p2. Here, the resonator Re_p1 has a resonance point and an anti-resonance point at a higher frequency than the resonator Re_p2. The resonator Re_p2 has a resonance point and an anti-resonance point at a lower frequency than the resonator Re_p1. In other words, of the parallel arms 22 and 23, the parallel arm 22 corresponds to a communication band further on the high-frequency side, and the parallel arm 23 corresponds to a communication band further on the low-frequency side. The element values of the variable capacitances Cs_p1 and Cs_p2 are controlled in order to appropriately adjust a cutoff frequency on the low-frequency side or the high-frequency side of the pass band for communication bands to which the parallel arms 22 and 23 in which the respective capacitances are provided correspond.

The parallel arm 22 further includes the serial inductor Ls_p1 and the parallel inductor Lp_p1 in order to widen the range of variation of the cutoff frequency that can be adjusted by controlling the variable capacitance Cs_p1. The parallel arm 23 further includes the parallel inductor Lp_p2 in order to widen the range of variation of the cutoff frequency that can be adjusted by controlling the variable capacitance Cs_p2. In this manner, in the filter circuit 20 according to the present variation, an asymmetrical circuit configuration, in which the serial inductor Ls_p1 is provided in the one parallel arm 22 but a serial inductor is omitted from the parallel arm 23, is employed. Omitting the serial inductor from the parallel arm 23 in this manner makes it possible to balance an expansion of the range of variation of the cutoff frequency with a reduction in the circuit size of the filter circuit 20.

Figure 16B:
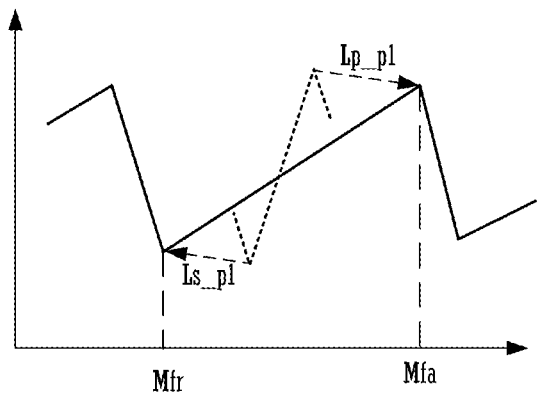
Figure 16C:
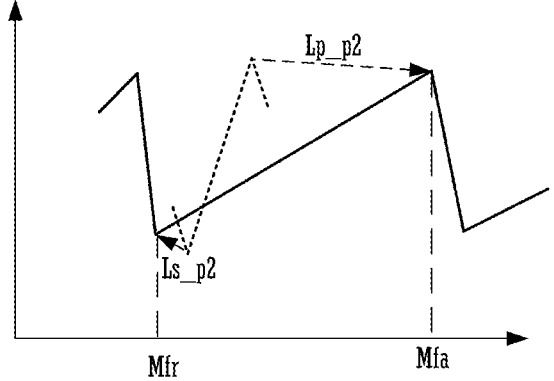

FIGS. 16B and 16C are conceptual diagrams schematically illustrating effects of the respective inductors on the impedance characteristics of a resonator. Impedance waveforms indicated by the dotted lines in the drawings are waveforms corresponding to the resonators only in the parallel arms 22 and 23, respectively, whereas impedance waveforms indicated by the solid lines are waveforms corresponding to the inductors Ls_p1 and Lp_p1 and the inductor Lp_p2 being added to the resonators.

For example, in the parallel arm 22 corresponding to the high-frequency side, a change in the waveform, relative to the impedance waveform of the resonator Re_p1, occurring near the anti-resonance point Mfa due to the influence of the parallel inductor Lp_p1 is substantially the same as a change in the waveform occurring near the resonance point Mfr due to the influence of the serial inductor Ls_p1, as illustrated in FIG. 16B. To rephrase, in the parallel arm 22 corresponding to the high-frequency side, an effect of expanding the range of variation of the cutoff frequency achieved by the serial inductor Ls_p1 acts to substantially the same extent as an effect of expanding the range of variation of the cutoff frequency achieved by the parallel inductor Lp_p1.

On the other hand, in the parallel arm 23 corresponding to the low-frequency side, there is a large change in the waveform, relative to the impedance waveform of the resonator Re_p2, occurring near the anti-resonance point Mfa due to the influence of the parallel inductor Lp_p2, and there is a small change in the waveform occurring near the resonance point Mfr due to the influence of the serial inductor (see Ls_p2 in FIG. 15), as illustrated in FIG. 16C. Accordingly, it is easy to maintain the steepness of the impedance change near the resonance point Mfr on the low-frequency side. To rephrase, in the parallel arm 23 corresponding to the low-frequency side, an effect of expanding the range of variation of the cutoff frequency achieved by the parallel inductor Lp_p2 acts to a greater extent, and an effect of expanding the range of variation of the cutoff frequency achieved by the serial inductor (Ls_p2) only acts to a lesser extent.

Accordingly, the serial inductor (Ls_p2) in the parallel arm 23 corresponding to a lower frequency may be most desirable as the inductor to be omitted in order to reduce the circuit size of the filter circuit 20. Omitting only the serial inductor (Ls_p2) of the parallel arm 23 makes it possible to suppress the circuit size of the filter circuit 20 without necessarily causing significant degradation in the filter characteristics of the filter circuit 20, narrowing of the range of variation of the cutoff frequency, and the like.

Note, however, that omitting the serial inductor (Ls_p2) of the parallel arm 23 tends to narrow the range of variation of the cutoff frequency that can be adjusted by controlling the variable capacitance Cs_p2 in the parallel arm 23. Accordingly, an element having a lower inductance than the parallel inductor Lp_p1 provided in the other parallel arm 22 can be set as the parallel inductor Lp_p2 provided in the parallel arm 23. Setting the parallel inductor Lp_p2 in this manner makes it possible to prevent significant narrowing of the range of variation of the cutoff frequency that can be adjusted by controlling the variable capacitance Cs_p2 in the parallel arm 23.

Figure 17:
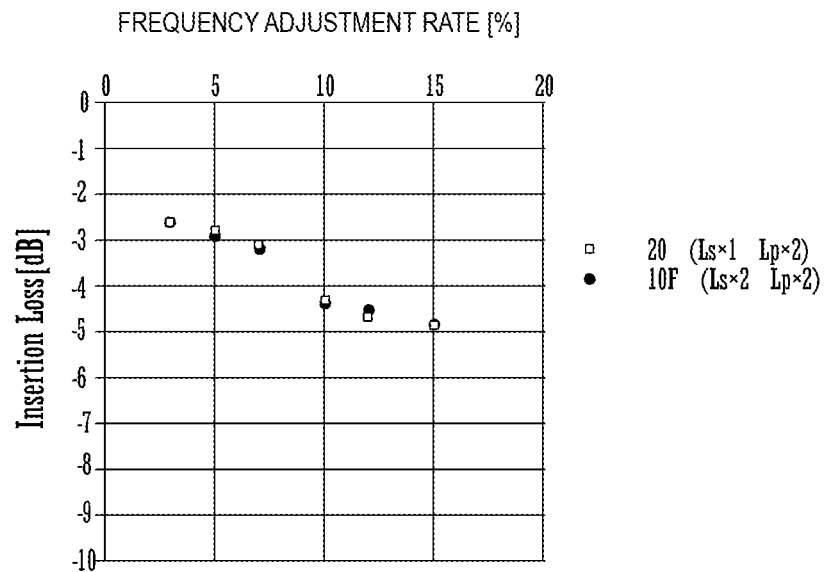
FIG. 17 is a diagram illustrating a result of a characteristic test of the variable filter circuit according to the third variation.

Results of experiments carried out for filter characteristics, using a plurality of pieces of sample data prepared for each of a plurality of circuit configurations having pass bands in predetermined communication bands, will be described next. FIG. 17 is a diagram comparing attenuations at points of minimum insertion loss in a pass band in various variable filter circuit configurations set to correspond to the same communication band. Each plot in FIG. 17 represents an average value of a plurality of pieces of sample data prepared for each of different circuit configurations. Additionally, a plurality of samples in which an adjustment amount of the variable capacitance (a frequency adjustment rate, corresponding to a percentage by which the center frequency of the pass band changes in response to controlling the variable capacitance) differs by constant amounts were prepared for each circuit configuration. Accordingly, in an actual variable filter circuit structure, desired filter characteristics are obtained by making fine adjustments to each variable capacitance. Additionally, a comparison between IL characteristics of the variable filter circuit 10F according to the aforementioned variation (see FIG. 15) and IL characteristics of the filter circuit 20 according to the present variation (see FIG. 16A) are indicated here.

From these experiment results, it can be seen that even if the configuration of the filter circuit 20, which omits the serial inductor (Ls_p2) of the parallel arm 23 corresponding to the low-frequency side, is employed, there is no significant degradation compared to the variable filter circuit 10F, in which all of the inductors are provided. It can thus also be confirmed, from experiments using sample data, that omitting only the serial inductor (Ls_p2) of the parallel arm 23, as in the filter circuit 20 according to the present embodiment, makes it possible to suppress the circuit size of the filter circuit 20 without necessarily causing significant degradation in the filter characteristics of the filter circuit 20.

<<Fourth Variation>>

Figure 18:
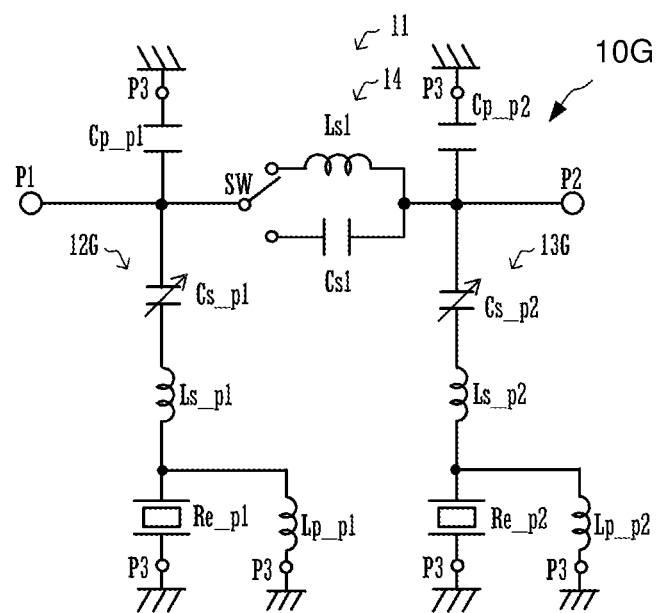
FIG. 18 is a circuit diagram of a filter circuit according to a fourth variation.

FIG. 18 is a circuit diagram illustrating a filter circuit 10G according to a fourth variation.

The filter circuit 10G includes the ports P1, P2, and P3, the serial arm 11, and parallel arms 12G and 13G. The parallel arm 12G includes the resonator Re_p1, the serial inductor Ls_p1, the parallel inductor Lp_p1, the variable capacitance Cs_p1, and a parallel capacitor Cp_p1. The parallel capacitor Cp_p1 is connected in series between the port P1 and the port P3. One end of the variable capacitance Cs_p1 is connected to the port P1. One end of the resonator Re_p1 is connected to the port P3. The serial inductor Ls_p1 is connected in series between the variable capacitance Cs_p1 and the resonator Re_p1. One end of the parallel inductor Lp_p1 is connected to a connection point between the serial inductor Ls_p1 and the resonator Re_p1, and another end of the parallel inductor Lp_p1 is connected to the port P3.

The parallel arm 13G includes the resonator Re_p2, the serial inductor Ls_p2, the parallel inductor Lp_p2, the variable capacitance Cs_p2, and a parallel capacitor Cp_p2. The parallel capacitor Cp_p2 is connected in series between the port P2 and the port P3. One end of the variable capacitance Cs_p2 is connected to the port P2. One end of the resonator Re_p2 is connected to the port P3. The serial inductor Ls_p2 is connected in series between the variable capacitance Cs_p2 and the resonator Re_p2. One end of the parallel inductor Lp_p2 is connected to a connection point between the serial inductor Ls_p2 and the resonator Re_p2, and another end of the parallel inductor Lp_p2 is connected to the port P3. Thus the present disclosure may be additionally provided with the parallel capacitors Cp_p1 and Cp_p2, as with the filter circuit 10G according to this variation.

Sixth Embodiment

Figure 19:
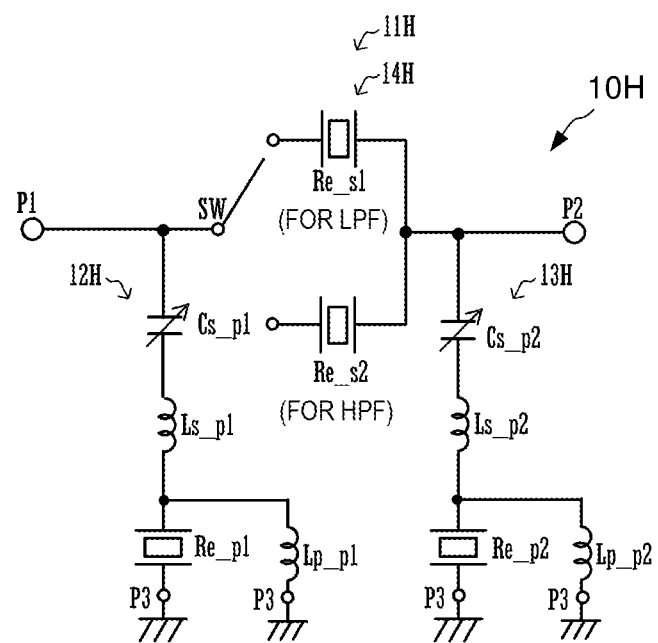
FIG. 19 is a circuit diagram of a filter circuit according to a sixth embodiment.

FIG. 19 is a circuit diagram illustrating a filter circuit 10H according to a sixth embodiment.

The filter circuit 10H includes the ports P1, P2, and P3, a serial arm 11H, and parallel arms 12H and 13H.

The parallel arms 12H and 13H include the resonators Re_p1 and Re_p2, the serial inductors Ls_p1 and Ls_p2, parallel inductors Lp_p1 and Lp_p2, and the variable capacitances Cs_p1 and Cs_p2. One end of the variable capacitance Cs_p1 is connected to the port P1. One end of the variable capacitance Cs_p2 is connected to the port P2. One end of each of the resonators Re_p1 and Re_p2 is connected to the port P3. The serial inductors Ls_p1 and Ls_p2 are connected in series between the variable capacitances Cs_p1 and Cs_p2 and the resonators Re_p1 and Re_p2. One end of each of the parallel inductors Lp_p1 and Lp_p2 is connected to a corresponding connection point between the serial inductors Ls_p1 and Ls_p2 and the resonators Re_p1 and Re_p2, and the other end is connected to the port P3.

The serial arm 11H includes a switching circuit 14H. The switching circuit 14H is connected in series between the port P1 and the port P2. The switching circuit 14H includes the switch SW, a resonator Re_s1, and a resonator Re_s2. The switch SW selects one of the resonator Re_s1 and the resonator Re_s2 and connects the selected resonator in series between the port P1 and the port P2. The resonator Re_s1 corresponds to a first reactance portion, and although details will be given later, has an inductive reactance in a specific frequency band. The resonator Re_s2 corresponds to a second reactance portion, and although details will be given later, has a capacitive reactance in a specific frequency band. The resonators Re_s1 and Re_s2 are both constituted of piezoelectric resonators such as SAW resonators, BAW resonators, or the like.

Here, the resonator Re_s1 is provided in order to fulfill the same role in the filter circuit 10H as the inductor Ls1 according to the first embodiment. Specifically, the resonator Re_s1 is configured so that the filter circuit 10H functions as a transmission filter corresponding to a communication band Band 28L (transmission band of 703 to 748 MHz; reception band of 758 to 803 MHz) when the resonator Re_s1 is selected in the switching circuit 14H.

Figure 20A:
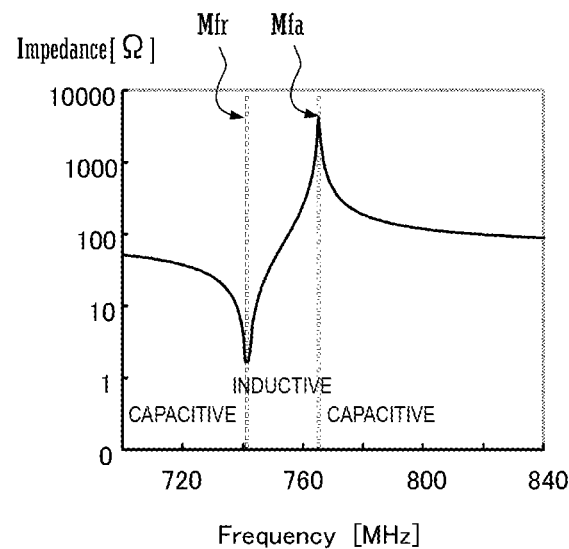
FIGS. 20A and 20B illustrate characteristic graphs of the filter circuit according to the sixth embodiment.

FIG. 20A is a diagram illustrating impedance characteristics for the resonator Re_s1 alone. The resonator Re_s1 has a resonance point Mfr at approximately 740 MHz, and has an anti-resonance point Mfa at approximately 765 MHz. The resonator Re_s1 has an inductive reactance in a band between the resonance point Mfr and the anti-resonance point Mfa (approximately 740 to 765 MHz), and has a capacitive reactance in a band further on the low-frequency side than the resonance point Mfr (up to approximately 740 MHz) and in a band further on the high-frequency side than the anti-resonance point Mfa (from approximately 765 MHz).

Figure 20B:
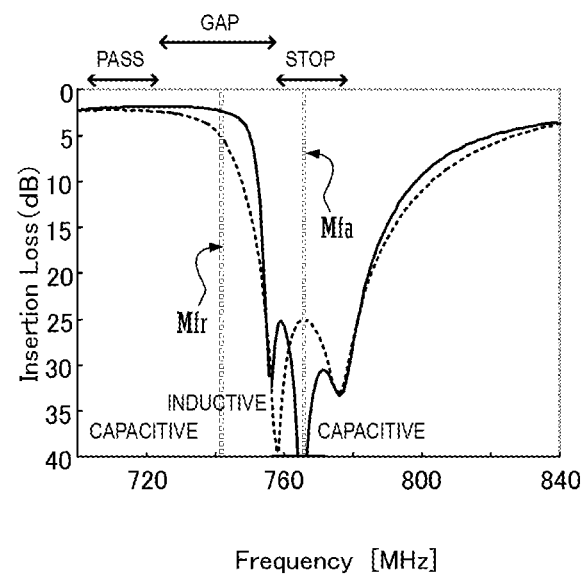

FIG. 20B is a diagram illustrating bandpass characteristics of the filter circuit 10H in a state where the resonator Re_s1 is selected in the switching circuit 14H. The solid line in FIG. 20B represents the bandpass characteristics of the filter circuit 10H when the resonator Re_s1 is connected. The broken line in FIG. 20B indicates bandpass characteristics in the case where an inductor is connected instead of the resonator Re_s1.

When the resonator Re_s1 is configured as described above, the cutoff frequency on a high-frequency side of the transmission band (pass band) in the communication band Band 28L overlaps with the band between the resonance point Mfr and the anti-resonance point Mfa in which the resonator Re_s1 functions as an inductive reactance (approximately 740 to 765 MHz). In other words, the band between the resonance point Mfr and the anti-resonance point Mfa (approximately 740 to 765 MHz) at least partially overlaps with a gap band between the transmission band and the reception band (748 to 758 MHz) in the communication band Band 28L. Accordingly, when the resonator Re_s1 is connected in the switching circuit 14H, filter characteristics having high steepness in the change in attenuation near the cutoff frequency on the high-frequency side of the pass band can be realized, in the same manner as the one when an inductor is connected in the switching circuit. Furthermore, as indicated by the solid line and the broken line in FIG. 20B, with the filter circuit 10H in which the resonator Re_s1 is connected, the steepness of the change in attenuation near the cutoff frequency on the high-frequency side of the pass band becomes greater than in a case where an inductor is connected instead of the resonator Re_s1. This is because a piezoelectric resonator having a high Q value is used as the resonator Re_s1.

The band between the resonance point Mfr and the anti-resonance point Mfa (approximately 740 to 765 MHz) can overlap with the gap band (748 to 758 MHz) and the pass band (703 to 748 MHz) of the communication band Band 28L in order to increase the steepness of the change in attenuation near the cutoff frequency. In particular, the resonance point Mfr of the resonator Re_s1 (approximately 740 MHz) can be present within the gap band (748 to 758 MHz) between the transmission band and the reception band in the communication band Band 28L.

Additionally, the resonator Re_s2 is provided in order to fulfill the same role in the filter circuit 10H as the capacitor Cs1 according to the first embodiment. Specifically, the resonator Re_s2 is configured so that the filter circuit 10H functions as a transmission filter corresponding to a communication band Band 13 (transmission band of 777 to 787 MHz; reception band of 746 to 756 MHz) when the resonator Re_s2 is selected in the switching circuit 14H.

Figure 21A:
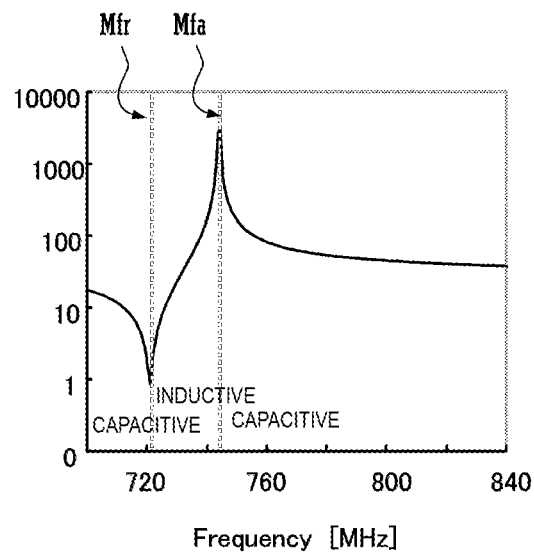
FIGS. 21A and 21B illustrate characteristic graphs of the filter circuit according to the sixth embodiment.

FIG. 21A is a diagram illustrating impedance characteristics for the resonator Re_s2 alone. The resonator Re_s2 has a resonance point Mfr at approximately 720 MHz, and has an anti-resonance point Mfa at approximately 745 MHz. The resonator Re_s2 also has an inductive reactance in a band between the resonance point Mfr and the anti-resonance point Mfa (approximately 720 to 745 MHz), and has a capacitive reactance in a band further on the low-frequency side than the resonance point Mfr (up to approximately 720 MHz) and in a band further on the high-frequency side than the anti-resonance point Mfa (from approximately 745 MHz).

Figure 21B:
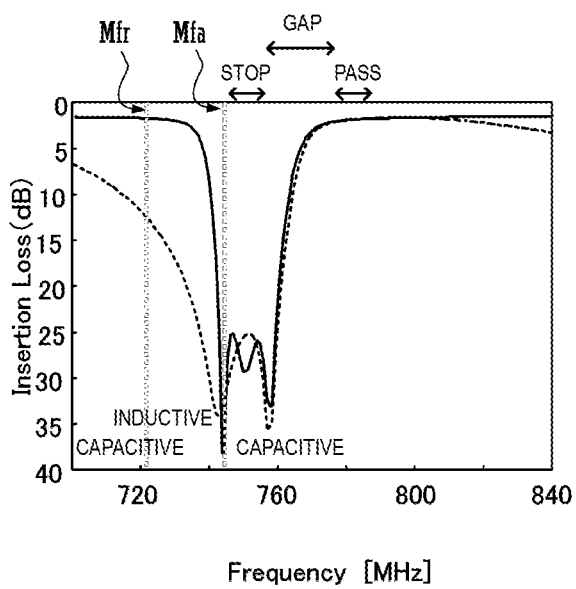

FIG. 21B is a diagram illustrating bandpass characteristics of the filter circuit 10H in a state where the resonator Re_s2 is selected in the switching circuit 14H. The solid line in FIG. 21B represents the bandpass characteristics of the filter circuit 10H when the resonator Re_s2 is connected. The broken line in FIG. 21B indicates bandpass characteristics in the case where a capacitor is connected instead of the resonator Re_s2.

When the resonator Re_s2 is configured as described above, the cutoff frequency on a low-frequency side of the transmission band (pass band) in the communication band Band 13 overlaps with the band further on the high-frequency side than the anti-resonance point Mfa, in which the resonator Re_s2 functions as a capacitive reactance (from approximately 745 MHz). In other words, a band further on the high-frequency side than the anti-resonance point Mfa of the resonator Re_s2 (from approximately 745 MHz) overlaps with the gap band between the transmission band and the reception band in the communication band Band 13 (756 to 777 MHz). Accordingly, when the resonator Re_s2 is connected in the switching circuit 14H, low pass filter characteristics having high steepness in the change in attenuation near the cutoff frequency on the low-frequency side of the pass band can be realized, in the same manner as the one when a capacitor is connected in the switching circuit. Furthermore, as indicated by the solid line and the broken line in FIG. 21B, with the filter circuit 10H in which the resonator Re_s2 is connected, the steepness of the change in attenuation near the cutoff frequency on the low-frequency side of the pass band becomes greater than in a case where a capacitor is connected instead of the resonator Re_s2. This is because a piezoelectric resonator having a high Q value is used as the resonator Re_s2.

The band further on the high-frequency side than the anti-resonance point Mfa (from approximately 745 MHz), a band further on the low-frequency side than the resonance point Mfr (up to approximately 720 MHz), and the like can overlap with the gap band (756 to 777 MHz) and the pass band (777 to 787 MHz) of the communication band Band 13 in order to increase the steepness of the change in attenuation near the cutoff frequency. In particular, if a band further on the high-frequency side than the anti-resonance point Mfa (from approximately 745 MHz) is used, the pass band characteristics of the resonator will overlap with the characteristics on the high-frequency side of an attenuation pole of the HPF, which increases the steepness of the change in attenuation near the cutoff frequency.

In this manner, in the filter circuit 10H as well, the bandpass characteristics can be switched between bandpass characteristics having a steep change in attenuation near the cutoff frequency on the high-frequency side of the pass band and bandpass characteristics having a steep change in attenuation near the cutoff frequency on the low-frequency side of the pass band by the switch SW selecting and connecting the resonator Re_s1 or selecting and connecting the resonator Re_s2 in the switching circuit 14H. Additionally, according to the filter circuit 10H of the present embodiment, providing the variable capacitances Cs_p1 and Cs_p2 makes it possible to adjust the cutoff frequency on the high-frequency side, the low-frequency side, and so on of the pass band while maintaining a high steepness near the cutoff frequency on the high-frequency side, the low-frequency side, and so on of the pass band. Additionally, the serial inductors Ls_p1 and Ls_p2 are provided, and thus the range of variation of the cutoff frequency on the high-frequency side, the low-frequency side, and the like of the pass band that can be adjusted by controlling the variable capacitances Cs_p1 and Cs_p2 can be made wider.

Furthermore, using piezoelectric resonators as the resonators Re_s1 and Re_s2 makes it possible to make the attenuation characteristics steeper as well as reduce the size of the filter circuit as a whole.

<<Fifth Variation>>

Figure 22:
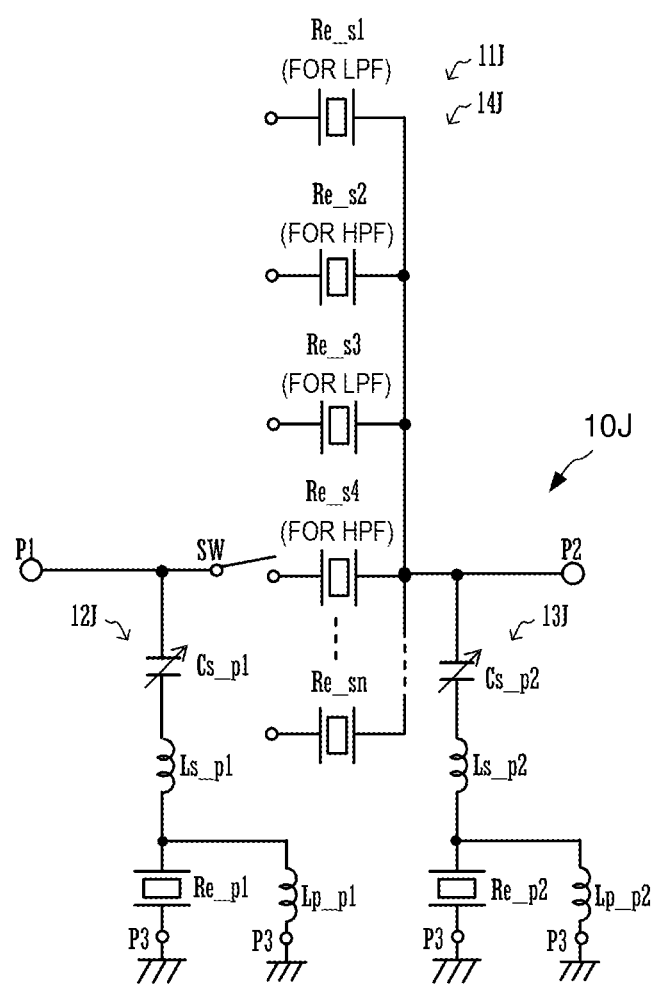
FIG. 22 is a circuit diagram of a filter circuit according to a fifth variation.

FIG. 22 is a circuit diagram illustrating a filter circuit 10J according to a fifth variation of the present disclosure.

The filter circuit 10J includes the ports P1, P2, and P3, a serial arm 11J, and parallel arms 12J and 13J. The serial arm 11J includes the switch SW and a total of n resonators Re_pn (where n is an integer of 1 or more). The filter circuit 10J is configured to be capable of handling a total of n types of communication bands by controlling the variable capacitances Cs_p1 and Cs_p2, and the n resonators Re_pn are provided so as to correspond respectively to the communication bands that can be handled. In the present disclosure, the serial arm 11J may be provided with multiple resonators, as in the filter circuit 10J according to this variation.

Seventh Embodiment

Figure 23:
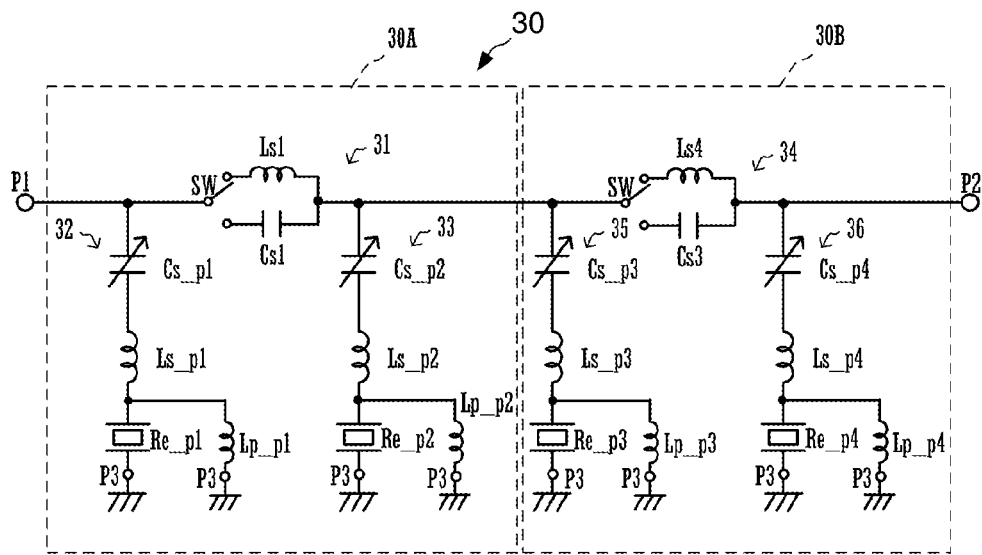
FIG. 23 is a circuit diagram of a variable filter circuit according to a seventh embodiment.

FIG. 23 is a circuit diagram illustrating a variable filter circuit 30 according to a seventh embodiment.

The variable filter circuit 30 includes a first circuit portion 30A and a second circuit portion 30B. The first circuit portion 30A and the second circuit portion 30B both have the same circuit configuration as the variable filter circuit 10F described earlier. The first circuit portion 30A includes a serial arm 31 and parallel arms 32 and 33. The second circuit portion 30B includes a serial arm 34 and parallel arms 35 and 36.

Here, the parallel arm 32 includes the resonator Re_p1, the variable capacitance Cs_p1, the serial inductor Ls_p1, and the parallel inductor Lp_p1. The parallel arm 33 includes the resonator Re_p2, the variable capacitance Cs_p2, the serial inductor Ls_p2, and the parallel inductor Lp_p2. The parallel arm 35 includes a resonator Re_p3, the variable capacitance Cs_p3, a serial inductor Ls_p3, and a parallel inductor Lp_p3. The parallel arm 36 includes a resonator Re_p4, a variable capacitance Cs_p4, a serial inductor Ls_p4, and a parallel inductor Lp_p4.

The resonators Re_p1 and Re_p2 and the resonators Re_p3 and Re_p4 respectively correspond to communication bands having different pass bands and stop bands. Additionally, the variable capacitances Cs_p1 and Cs_p2 and the variable capacitances Cs_p3 and Cs_p4 are controlled to appropriate element values in order to appropriately set filter characteristics in the communication bands to which the resonators Re_p1 and Re_p2 or the resonators Re_p3 and Re_p4 that are connected correspond. The serial inductors Ls_p1 and Ls_p2 and the serial inductors Ls_p3 and Ls_p4, and the parallel inductors Lp_p1 and Lp_p2 and the parallel inductors Lp_p3 and Lp_p4, are each set to appropriate element values in order to appropriately set filter characteristics in the communication bands to which the resonators Re_p1 and Re_p2 or the resonators Re_p3 and Re_p4 that are connected correspond.

In this manner, the variable filter circuit can be implemented as a multi-stage circuit by connecting a plurality of circuit portions 30A and 30B corresponding to the filter circuit 10F. Having the circuit portions 30A and 30B (filter 10B) handle different frequency bands makes it possible to improve the filter characteristics of the circuit portions 30A and 30B (filter 10B), respectively. As a result, the variable filter circuit can be caused to handle many communication bands.

Although the first circuit portion 30A and the second circuit portion 30B are described here as having the same circuit configuration as the variable filter circuit 10F described above, the circuit configurations according to other variations and the circuit configurations according to other embodiments may be combined as appropriate. Additionally, a greater number of circuit portions may be connected and used as well.

Eighth Embodiment

Figure 24:
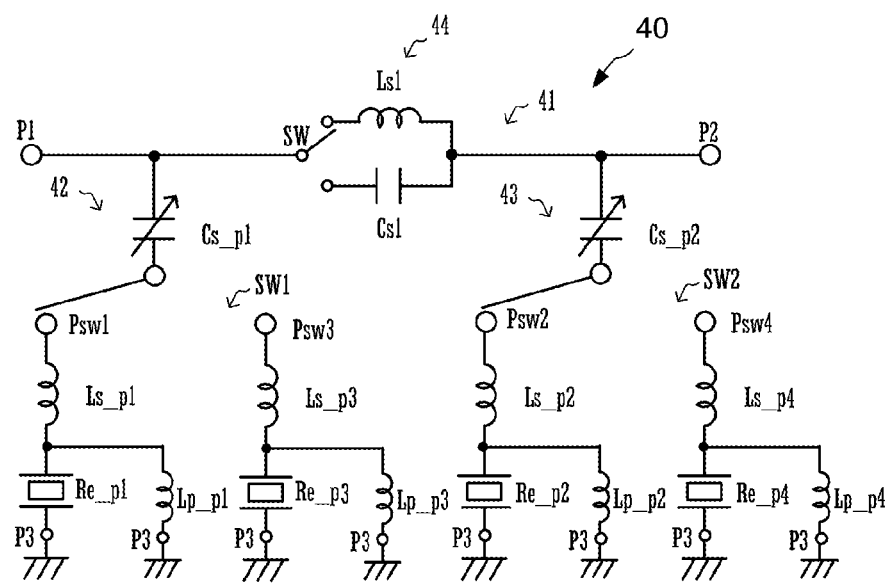
FIG. 24 is a circuit diagram of a variable filter circuit according to an eighth embodiment.

FIG. 24 is a circuit diagram illustrating a variable filter circuit 40 according to an eighth embodiment.

The variable filter circuit 40 includes a serial arm 41 and parallel arms 42 and 43. The parallel arm 42 includes the variable capacitance Cs_p1, a resonator selecting portion SW1, the resonators Re_p1 and Re_p3, the serial inductors Ls_p1 and Ls_p3, and the parallel inductors Lp_p1 and Lp_p3. The parallel arm 43 includes the variable capacitance Cs_p2, a resonator selecting portion SW2, the resonators Re_p2 and Re_p4, the serial inductors Ls_p2 and Ls_p4, and the parallel inductors Lp_p2 and Lp_p4.

The resonator selecting portion SW1 is connected to the port P3 (ground connection end) side of the variable capacitance Cs_p1. The resonator selecting portion SW1 includes a connection switching port Psw1 and a connection switching port Psw3, and can switch the connection switching port Psw1 and the connection switching port Psw3 to connect to the variable capacitance Cs_p1. The resonator Re_p1, the serial inductor Ls_p1, and the parallel inductor Lp_p1 are connected to the connection switching port Psw1. The resonator Re_p3, the serial inductor Ls_p3, and the parallel inductor Lp_p3 are connected to the connection switching port Psw3.

The resonator selecting portion SW2 is connected to the port P3 (ground connection end) side of the variable capacitance Cs_p2. The resonator selecting portion SW2 includes a connection switching port Psw2 and a connection switching port Psw4, and can switch the connection switching port Psw2 and the connection switching port Psw4 to connect to the variable capacitance Cs_p2. The resonator Re_p2, the serial inductor Ls_p2, and the parallel inductor Lp_p2 are connected to the connection switching port Psw2. The resonator Re_p4, the serial inductor Ls_p4, and the parallel inductor Lp_p4 are connected to the connection switching port Psw4.

Like the seventh embodiment, in the present embodiment, the resonators Re_p1, Re_p2, Re_p3, and Re_p4 respectively correspond to communication bands having different pass bands and stop bands. Additionally, the variable capacitances Cs_p1 and Cs_p2 are controlled to appropriate element values in order to appropriately set filter characteristics in the communication bands to which the resonators Re_p1, Re_p2, Re_p3, and Re_p4 that are connected correspond. The serial inductors Ls_p1, Ls_p2, Ls_p3, and Ls_p4, and the parallel inductors Lp_p1, Lp_p2, Lp_p3, and Lp_p4, are each set to appropriate element values in order to appropriately set filter characteristics in the communication bands to which the resonators Re_p1, Re_p2, Re_p3, and Re_p4 that are connected correspond.

Figures 25A, 25B:
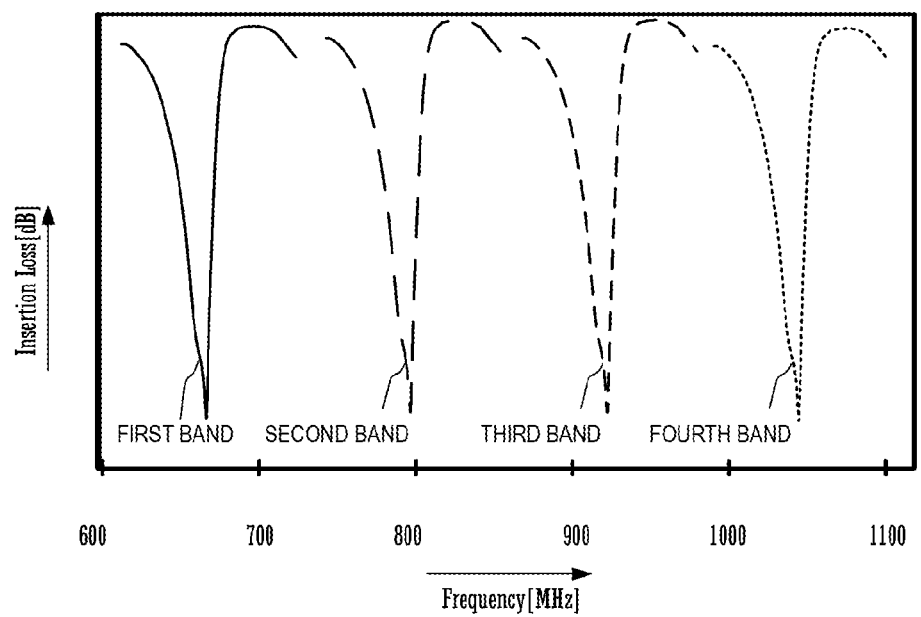
FIGS. 25A and 25B include a chart and a characteristic graph schematically illustrating a function of a variable filter circuit according to the eighth embodiment.

Additionally, with the variable filter circuit 40, the filter characteristics are changed and the corresponding communication band is changed by controlling the resonator selecting portion SW1 to connect one of the connection switching ports Psw1 and Psw3 to the variable capacitance Cs_p1 and by controlling the resonator selecting portion SW2 to connect one of the connection switching ports Psw2 and Psw4 to the variable capacitance Cs_p2. FIGS. 25A and 25B include a chart and a characteristic graph schematically illustrating a correspondence relationship between control states of the resonator selecting portions SW1 and SW2 and the filter characteristics of the variable filter circuit 40. FIG. 25A is a chart illustrating examples of settings for the control states of the resonator selecting portions SW1 and SW2, and FIG. 25B is a characteristic graph indicating changes in a pass band determined according to the settings for the control states of the resonator selecting portions SW1 and SW2.

For example, when causing the filter characteristics of the variable filter circuit 40 to correspond to a first band or a second band, among a plurality of communication bands, that are on the low-frequency side, the resonator selecting portions SW1 and SW2 are controlled so that the connection switching port Psw1 is selected and connected by the resonator selecting portion SW1 and the connection switching port Psw2 is selected and connected by the resonator selecting portion SW2. Furthermore, by controlling the variable capacitance, the pass band of the variable filter circuit 40 are adjusted to the first band or the second band.

Additionally, when causing the filter characteristics of the variable filter circuit 40 to correspond to a third band or a fourth band, among a plurality of communication bands, that are on the high-frequency side, the resonator selecting portions SW1 and SW2 are controlled so that the connection switching port Psw3 is selected and connected by the resonator selecting portion SW1 and the connection switching port Psw4 is selected and connected by the resonator selecting portion SW2. Furthermore, by controlling the variable capacitance, the pass band of the variable filter circuit 40 are adjusted to the third band or the fourth band.

According to this variable filter circuit 40, the resonator selecting portion SW1 is controlled to connect one of the connection switching ports Psw1 and Psw3 to the variable capacitance Cs_p1 and the resonator selecting portion SW2 is controlled to connect one of the connection switching ports Psw2 and Psw4 to the variable capacitance Cs_p2. Accordingly, a large frequency adjustment can be made by the switching performed by the resonator selecting portions SW1 and SW2, and a fine frequency adjustment can be made by adjusting the variable capacitance. This makes it possible to change the filter characteristics of the variable filter circuit 40 so as to correspond to many communication bands.

Furthermore, according to this variable filter circuit 40, many communication bands can be handled without necessarily increasing the total number of serial arms, increasing the total number of variable capacitances, and so on. For example, in the seventh embodiment described earlier, it is necessary to provide substantially the same number of parallel arms as there are communication bands to be handled, and thus the total number of elements tends to rise due to the elements being provided in each of the parallel arms. However, in the present embodiment, the resonator selecting portions SW1 and SW2 are provided and the variable capacitances Cs_p1 and Cs_p2 are shared among the plurality of communication bands, and thus it is no longer necessary to provide the elements of the parallel arms for each of the communication bands. The total number of the variable capacitances Cs_p1 and Cs_p2 can therefore be suppressed, which makes it possible to prevent the circuit size from increasing, the control of the variable capacitances Cs_p1 and Cs_p2 from becoming complicated, and so on.

Although this embodiment describes an example in which the serial inductors, parallel inductors, and the like provided in the respective parallel arms are connected to the connection switching port sides of the resonator selecting portions, the serial inductors, parallel inductors, and the like may be connected to the variable capacitance sides of the resonator selecting portions. In this case, the total number of serial inductors, parallel inductors, and so on provided in each parallel arm can be suppressed, which makes it possible to further suppress the circuit size. Additionally, although an example in which there are a total of two connection switching ports, resonators, and so on provided in each resonator selecting portion is described here, a total of more than two connection switching ports, resonators, and so on may be provided in each resonator selecting portion. In this case, the variable filter circuit can handle a greater number of communication bands.

The present disclosure can be carried out as described thus far. Note that the present disclosure can be carried out through any other configuration aside from those described in the foregoing embodiments as long as that configuration corresponds to the configurations described in the appended claims. For example, although the switch SW is provided only on one end side of the switching circuit in the above-described embodiments, the switch SW may be provided on the other end side of the switching circuit, or may be provided on both end sides of the switching circuit.

REFERENCE SIGNS LIST

9 WIRELESS COMMUNICATION APPARATUS
1 ANTENNA
2 FRONT END CIRCUIT
3 TRANSMISSION CIRCUIT
4 RECEPTION CIRCUIT
10 FILTER CIRCUIT
11 SERIAL ARM
12, 13 PARALLEL ARM
14 SWITCHING CIRCUIT

The invention claimed is:

1. A filter circuit comprising:
 a serial arm connected between a first input/output end and a second input/output end,
 a first parallel arm including a first resonator connected in series between the first input/output end and a ground connection end, and a second parallel arm including a second resonator connected in series between the second input/output end and the ground connection end, wherein the serial arm includes a switching circuit connected in series between the first input/output end and the second input/output end, the switching circuit has a plurality of reactance portions among which one of the plurality of reactance portions is connected in series between the first input/output end and the second input/output end by the switching circuit, the plurality of reactance portions include a first reactance portion and a second reactance portion, the first reactance portion including a capacitor and the second reactance portion including an inductor, and wherein when the first reactance portion is connected between the first input/output end and the second input/output, a frequency at an anti-resonance point of the first resonator is at a high-frequency side of a resonance point of the first resonator, and an anti-resonance point of the second resonator is at a high-frequency side of a resonance point of the second resonator, when the second reactance portion is connected between the first input/output end and the second input/output, the frequency at the anti-resonance point of the first resonator is at a low-frequency side of the resonance point of the first resonator, and the resonance point of the second resonator is at a low-frequency side of the resonance point of the second resonator, and the low-frequency side comprises lower frequencies than the high-frequency side.

2. The filter circuit according to claim 1, wherein at least one of the first parallel arm and the second parallel arm further includes a serial inductor connected in series to the first or second resonator.

3. The filter circuit according to claim 1, wherein at least one of the first parallel arm and the second parallel arm further includes a parallel inductor connected in parallel to the first or second resonator.

4. The filter circuit according to claim 1, wherein at least one of the first parallel arm and the second parallel arm is configured to include a parallel inductor connected in parallel to the first or second resonator and a serial inductor connected in series to a circuit in which the first and second resonator and the parallel inductor are connected in parallel.

5. The filter circuit according to claim 1, wherein at least one of the first parallel arm and the second parallel arm is configured to include a serial inductor connected in series to the first or second resonator and a parallel inductor connected in parallel to a circuit in which the first or second resonator and the serial inductor are connected in series.

6. The filter circuit according to claim 1, wherein at least one of the first and second parallel arms further include a variable reactance connected in series to the first or second resonator.

7. The filter circuit according to claim 6, wherein at least one of the first parallel arm and the second parallel arm includes a plurality of resonators and a resonator switch that selects one of the plurality of resonators and connects the selected resonator in series to the variable reactance.

8. The filter circuit according to claim 7,
wherein at least one of the first parallel arm and the second parallel arm includes a plurality of serial inductors respectively connected in series to the plurality of resonators; and the resonator switch selects one of the plurality of serial inductors and one of the plurality of resonators as a set and connects the selected inductor and the selected resonator in series to the variable reactance.

9. The filter circuit according to claim 7,
wherein at least one of the first parallel arm and the second parallel arm includes a plurality of parallel inductors respectively connected in parallel to the plurality of resonators; and the resonator switch selects one of the plurality of parallel inductors and one of the plurality of resonators as a set and connects the selected inductor and the selected resonator in series to the variable reactance.

10. A wireless communication apparatus comprising:
a front end circuit including the filter circuit according to claim 6;

an antenna; and a communication circuit connected to the antenna through the front end circuit, wherein the communication circuit handles a plurality of communication bands;

when at least one of the parallel arms does not include the variable reactance, anti-resonance point is higher than an upper limit frequency on a high-frequency side of a pass band of the communication band, among the plurality of communication bands, that is furthest on the high-frequency side; and when at least one of the parallel arms does not include the variable reactance, a resonance point is lower than a lower limit frequency on a low-frequency side of a pass band of the communication band, among the plurality of communication bands, that is furthest on the low-frequency side.

11. A wireless communication apparatus comprising:
a front end circuit including the filter circuit according to claim 6;

an antenna; and a communication circuit connected to the antenna through the front end circuit, wherein the filter circuit includes a serial inductor connected in series to each of the resonators;

the communication circuit handles a plurality of communication bands; and when at least one of the parallel arms does not include the variable reactance, a sub-resonance point is lower than a lower limit frequency on a low-frequency side of a pass band of the communication band, among the plurality of communication bands, that is furthest on the low-frequency side.

12. The filter circuit according to claim 1,
wherein the first parallel arm further includes a first parallel inductor connected in parallel to the first resonator and the second parallel arm further includes a second parallel inductor connected in parallel to the second resonator;

the first parallel arm includes a serial inductor connected in series to the first resonator; and the second parallel arm does not include a serial inductor connected in series to the second resonator.

13. The filter circuit according to claim 12, wherein the first parallel arm further includes a first series variable reactance connected in series to the first resonator and the second parallel arms further include a second series variable reactance connected in series to the second resonator.

14. The filter circuit according to claim 13, wherein an inductance of the second parallel inductor included in the second parallel arm is lower than an inductance of the first parallel inductor included in the first parallel arm.

15. The filter circuit according to claim 12, wherein a resonance point and an anti-resonance point of the first resonator included in the first parallel arm are further on a high-frequency side than a resonance point and an anti-resonance point of the second resonator included in the second parallel arm.

16. The filter circuit according to claim 1, wherein the plurality of reactance portions further include a third reactance portion including a piezoelectric resonator.

17. A wireless communication apparatus comprising:
a front end circuit including the filter circuit according to any one of claim 16;
an antenna; and
a communication circuit connected to the antenna through the front end circuit,
wherein when the inductor or the piezoelectric resonator is connected in series between the first input/output end and the second input/output end by the switching circuit, the communication circuit at least transmits and receives signals in a first communication band having a pass band further on a low-frequency side than a stop band when the first reactance portion is connected in series between the first input/output end and the second input/output end by the switching circuit, or
when the capacitor or the piezoelectric resonator is connected in series between the first input/output end and the second input/output end by the switching circuit, the communication circuit at least transmits and receives signals in a second communication band having a pass band further on a high-frequency side than a stop band.

18. The wireless communication apparatus according to claim 17, wherein when the piezoelectric resonator is connected in series between the first input/output end and the second input/output end by the switching circuit, a band between a resonance point of the piezoelectric resonator and an anti-resonance point of the piezoelectric resonator at least partially overlaps with a gap band between the pass band and the stop band in the first communication band.

19. The wireless communication apparatus according to claim 17, wherein when the piezoelectric resonator is connected in series between the first input/output end and the second input/output end by the switching circuit, a band further on a low-frequency side than a resonance point of the piezoelectric resonator or a band further on a high-frequency side than an anti-resonance point of the piezoelectric resonator at least partially overlaps with a gap band between the pass band and the stop band in the second communication band.

\* \* \* \* \*